US012744547B2

(12) United States Patent
Park et al.

(10) Patent No.: US 12,744,547 B2
(45) Date of Patent: Sep. 22, 2026

(54) WIDE RANGE FULL-SCALE CURRENT CONFIGURABLE CURRENT-STEERING DIGITAL-TO-ANALOG CONVERTER (DAC)

(71) Applicant: QUALCOMM Incorporated, San Diego, CA (US)

(72) Inventors: Beomsoo Park, San Diego, CA (US); Ashok Swaminathan, Cardiff, CA (US); Negar Rashidi, Mission Viejo, CA (US); Nitz Saputra, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 19 days.

(21) Appl. No.: 18/929,423

(22) Filed: Oct. 28, 2024

(65) Prior Publication Data

US 2026/0121658 A1 Apr. 30, 2026

(51) Int. Cl.
*H03M 1/78* (2006.01)
*H04B 1/04* (2006.01)

(52) U.S. Cl.
CPC .............. *H03M 1/785* (2013.01); *H04B 1/04* (2013.01)

(58) Field of Classification Search
CPC ............ H03M 1/00; H03M 1/66; H03M 1/74; H03M 1/78; H03M 1/785; H03M 1/68; H03M 1/687; H03M 1/76; H03M 1/765; H03M 1/742; H03M 1/745; H04B 1/00; H04B 1/02; H04B 1/04; H04B 1/0003; H04B 1/0007; H04B 1/0028
See application file for complete search history.

(56) References Cited

U.S. PATENT DOCUMENTS

| | | | | |
|---|---|---|---|---|
| 6,275,179 B1 * | 8/2001 | Mori | H03M 1/068 | 341/144 |
| 6,304,201 B1 * | 10/2001 | Moreland | H03M 1/1061 | 341/154 |
| 7,283,082 B1 * | 10/2007 | Kuyel | H03M 1/682 | 341/145 |
| 7,884,747 B2 * | 2/2011 | McLachlan | H03M 1/0845 | 341/154 |
| 8,462,036 B2 * | 6/2013 | Narathong | H03B 5/1228 | 331/34 |
| 8,558,727 B2 * | 10/2013 | McGowan | H03M 1/0863 | 341/144 |
| 8,847,801 B2 * | 9/2014 | Song | H03M 1/1061 | 341/120 |

(Continued)

OTHER PUBLICATIONS

International Search Report and Written Opinion—PCT/US2025/052453—ISA/EPO—Feb. 5, 2026.

*Primary Examiner* — James M Perez
(74) *Attorney, Agent, or Firm* — Gerald P. Joyce, III

(57) ABSTRACT

Certain aspects of the present disclosure are directed towards a DAC comprising a plurality of DAC cells, wherein each of the DAC cells comprises: a first current source coupled to an output of the DAC cell; a second current source coupled to the output of the DAC cell; a resistive network including a plurality of resistive elements coupled between a voltage rail and the first current source, wherein the resistive network is coupled to the first current source and the second current source; and a plurality of switches coupled between the voltage rail and respective nodes of the resistive network.

20 Claims, 18 Drawing Sheets

(56) References Cited

U.S. PATENT DOCUMENTS 8,884,799 B2 * 11/2014 Price ........................ H03M 1/78 341/145
8,907,832 B2 * 12/2014 Price ........................ H03M 1/68 341/145
8,922,409 B2 * 12/2014 Tao ........................ H03M 1/66 341/135
9,059,733 B2 * 6/2015 Narathong .............. H03M 1/66
9,083,380 B2 * 7/2015 Price ........................ H03M 1/78
9,088,319 B2 * 7/2015 Peng ...................... H03F 1/3241
9,160,357 B1 * 10/2015 Song ..................... H03M 1/1057
9,178,528 B1 * 11/2015 Waltari ................... H03M 1/66
9,379,727 B1 * 6/2016 Seo ........................... G05F 1/56
9,548,752 B1 * 1/2017 Shrivastava ............ H03M 1/66
9,853,654 B2 * 12/2017 Naderi Alizadeh ... H03M 3/368
9,991,900 B1 * 6/2018 Kabir .................. H03M 1/0673
10,333,544 B1 * 6/2019 Price ........................ H03M 1/68
10,454,487 B1 * 10/2019 Sedighi ................. H03M 1/742
10,469,097 B1 * 11/2019 Bothra ................ H03F 3/45188
10,581,450 B1 * 3/2020 Farley ................. H03F 3/45188
10,862,500 B1 * 12/2020 Pelliconi ................. H03F 3/245
10,892,771 B1 * 1/2021 Narula ................ H03M 1/0678
10,944,417 B1 * 3/2021 Lahiri ................... H03M 1/742
10,998,915 B2 * 5/2021 Moreira ................ H03M 1/747
11,016,732 B1 * 5/2021 Far ......................... G06F 7/5443
11,184,018 B1 * 11/2021 Liu ...................... H03K 5/1565
11,271,576 B1 * 3/2022 Weil .................... H03M 1/1009
11,394,393 B1 * 7/2022 Lahiri ................... H03M 1/661
11,502,706 B2 * 11/2022 Liu ......................... H03M 1/66
11,705,921 B2 * 7/2023 Liu ......................... H03M 1/74 455/127.1
11,728,822 B2 * 8/2023 Mehdizad Taleie .. H03M 1/785 341/144
12,040,809 B2 * 7/2024 Zhou ................... H03M 1/0612
12,040,817 B2 * 7/2024 Saputra ............... H03M 1/1057
12,081,229 B2 * 9/2024 Ramprasad ............. H03M 1/08
12,081,233 B2 * 9/2024 Fei ......................... H03M 1/785
12,113,499 B2 * 10/2024 Gazzerro ................ H03M 1/66
12,160,244 B2 * 12/2024 Zhou ........................ H03M 1/66
12,191,896 B2 * 1/2025 Liu ....................... H03M 1/002
12,362,761 B2 * 7/2025 Zhou ................... H03M 1/0614
12,381,572 B2 * 8/2025 Fei ......................... H03M 1/742
12,401,374 B2 * 8/2025 Weil ....................... H03M 1/742
12,483,257 B2 * 11/2025 Kalani ................ H03M 1/1033
2004/0257058 A1 * 12/2004 Hirata ........................ G05F 3/22 323/313
2005/0128117 A1 * 6/2005 Koo ................. H03K 17/04106 341/144
2008/0024343 A1 * 1/2008 Rose ........................ H03M 1/08 341/144
2011/0095807 A1 * 4/2011 de Jong ................. H03D 7/166 327/355
2011/0103508 A1 * 5/2011 Mu ........................... H03F 3/24 375/295
2011/0129037 A1 * 6/2011 Staszewski ............. H03F 3/193 375/316
2012/0146828 A1 * 6/2012 Narathong .............. H03M 1/66 331/34
2012/0293347 A1 * 11/2012 McGowan .......... H03M 1/0863 341/118
2013/0241754 A1 * 9/2013 Narathong ........... H03B 5/1228 327/331
2013/0314262 A1 * 11/2013 Tao ......................... H03M 1/66 327/109
2014/0240152 A1 * 8/2014 Song ................... H03M 1/1061 341/120
2014/0266835 A1 * 9/2014 Price ........................ H03M 1/06 341/145
2014/0266836 A1 * 9/2014 Price ........................ H03M 1/68 341/145
2019/0036541 A1 * 1/2019 Wong .................... H03M 1/747
2019/0140656 A1 * 5/2019 Downey ............... H03M 1/785
2019/0245553 A1 * 8/2019 Bolatkale .............. H03M 3/424
2019/0280704 A1 * 9/2019 Bodnar ................. H03M 1/067
2019/0280705 A1 * 9/2019 Bodnar ................. H03M 1/802
2019/0334543 A1 * 10/2019 Luo ......................... H03M 1/68
2019/0386690 A1 * 12/2019 Hashemi ................... H03F 3/21
2020/0007088 A1 * 1/2020 Ranta ......................... H03F 1/22
2021/0126648 A1 * 4/2021 Zhang ................. H03M 1/1061
2021/0152167 A1 * 5/2021 Doppalapudi ........... H03K 7/08
2021/0258027 A1 * 8/2021 Yoo .................... H03K 17/6872
2021/0391871 A1 * 12/2021 Liu ......................... G05F 3/262
2022/0109460 A1 * 4/2022 Liu ..................... H03M 1/0863
2022/0337258 A1 * 10/2022 Shen .................... G11C 27/024
2022/0352899 A1 * 11/2022 Saputra .................. H03K 19/21
2022/0416804 A1 * 12/2022 Mehdizad Taleie .. H03M 1/466
2023/0024327 A1 * 1/2023 Zhou ..................... H03M 1/745
2023/0096484 A1 * 3/2023 Pearce ................ H03F 3/45941 330/296
2023/0099719 A1 * 3/2023 Peting ..................... H03F 3/217 381/74
2023/0336187 A1 * 10/2023 Saputra ................... H03M 1/76
2023/0403022 A1 * 12/2023 Zhou ................... H03M 1/1009
2024/0014824 A1 * 1/2024 Ramprasad ............. H03M 1/08
2024/0162921 A1 * 5/2024 Chakraborty ........ H04B 1/0028
2024/0204753 A1 * 6/2024 Gazzerro ................. H03H 7/12
2024/0348260 A1 * 10/2024 Nandi ..................... H03M 1/66
2024/0421828 A1 * 12/2024 Fei ........................ H03M 1/742
2024/0429937 A1 * 12/2024 Zhou ................... H03M 1/0614
2025/0385682 A1 * 12/2025 Park .................... H03M 1/1014
2026/0121658 A1 * 4/2026 Park ...................... H03M 1/785

* cited by examiner

WIDE RANGE FULL-SCALE CURRENT CONFIGURABLE CURRENT-STEERING DIGITAL-TO-ANALOG CONVERTER (DAC)

TECHNICAL FIELD

Certain aspects of the present disclosure generally relate to electronic circuits and, more particularly, to digital-to-analog converters (DACs).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TxDAC), which may be used, for example, to convert a digital signal to an analog signal for signal processing (e.g., filtering, upconverting, and amplifying) before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled “Detailed Description,” one will understand how the features of this disclosure provide advantages that include improved full-scale current scaling in a digital-to-analog converter (DAC).

Certain aspects of the present disclosure are directed towards a DAC comprising a plurality of DAC cells, wherein at least one of the DAC cells comprises: a first current source coupled to an output of the DAC cell; a second current source coupled to the output of the DAC cell; a resistive network including a plurality of resistive elements coupled between a voltage rail and the first current source, wherein the resistive network is coupled to the first current source and the second current source; and a plurality of switches coupled between the voltage rail and nodes of the resistive network.

Certain aspects of the present disclosure are directed towards a method for digital-to-analog conversion. The method generally includes receiving a digital input code at an input of a DAC comprising a plurality of DAC cells and generating, via the DAC, an analog output signal based on the digital input code, wherein each DAC cell of a set of the DAC cells comprises: a first current source coupled to an output of the DAC cell; a second current source coupled to the output of the DAC cell; a resistive network including a plurality of resistive elements coupled between a voltage rail and the first current source, wherein the resistive network is coupled to the first current source and the second current source; and a plurality of switches coupled between the voltage rail and respective nodes of the resistive network.

Certain aspects of the present disclosure are directed towards a wireless device. The wireless device generally includes one or more antennas, a DAC comprising a plurality of DAC cells, a transmit path coupled between the DAC and the one or more antennas, wherein at least one of the DAC cells comprises: a first current source coupled to an output of the DAC cell; a second current source coupled to the output of the DAC cell; a resistive network including a plurality of resistive elements coupled between a voltage rail and the first current source, wherein the resistive network is coupled to the first current source and the second current source; and a plurality of switches coupled between the voltage rail and nodes of the resistive network.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for digital-to-analog conversion, such as a digital-to-analog converter (DAC) with an adjustable resistor network. The adjustable resistor network may allow the voltage drop across the resistor network to be set to a specific voltage based on different full-scale currents (as set by a bias current) of the DAC. That is, as the full-scale current ($I_{FS}$) for a DAC cell increases, the amount of degeneration resistance may be decreased to maintain a specific effective voltage for a transistor implementing a current source of the DAC cell. For example, switches may be controlled to adjust the $I_{FS}$ path across different quantities of resistive elements depending on whether the $I_{FS}$ is set to a base value, twice the base value, four times the base value, eight times the base value, or sixteen times the base value, as described in more detail herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
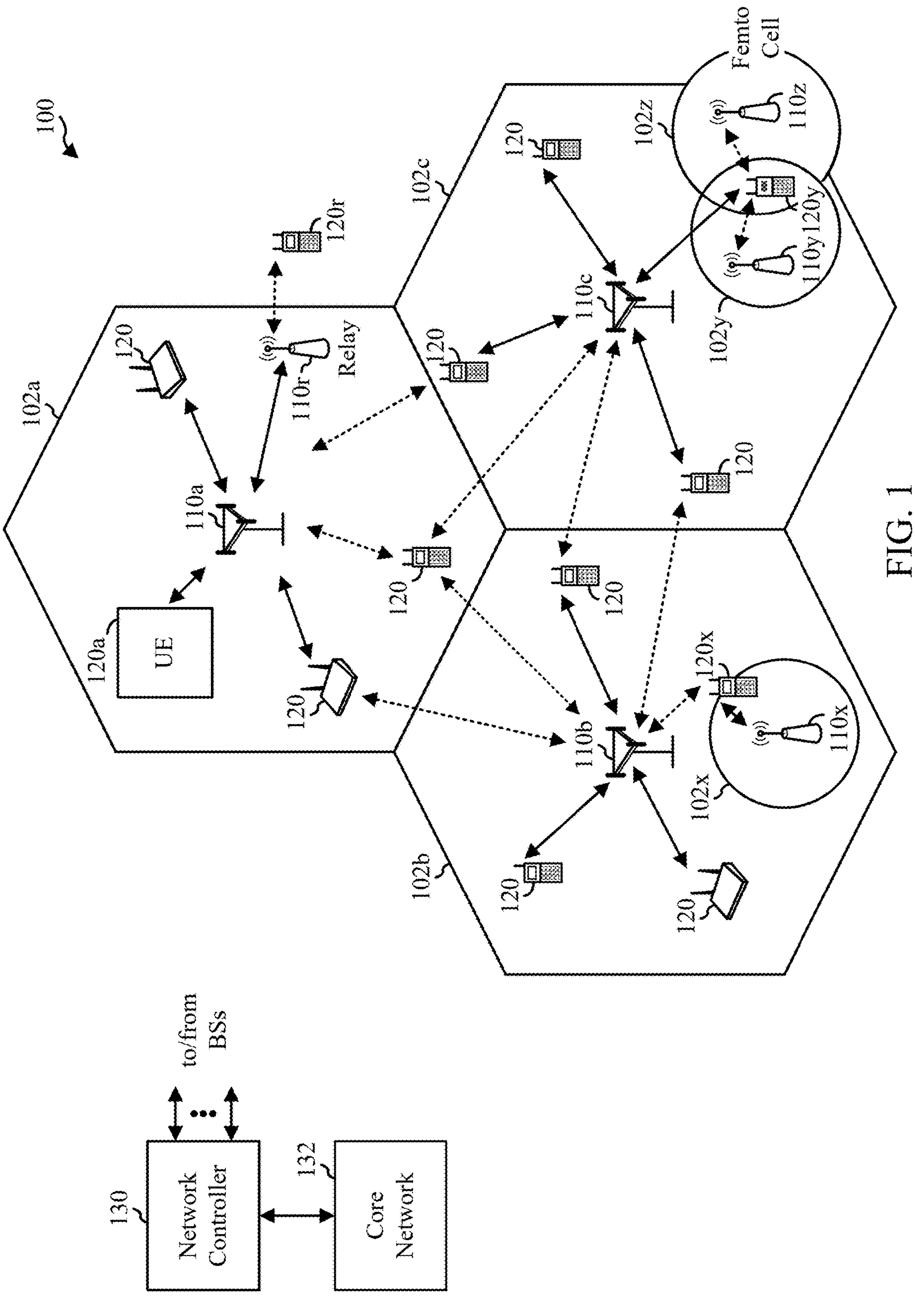
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receives user-specific data from the BSs 110. In general, each UE 120 may be equipped with one or multiple antennas. The $N_u$ UEs 120 can have the same or different number of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a digital-to-analog converter (DAC) with an adjustable resistor network, as described in more detail herein.

Figure 2:
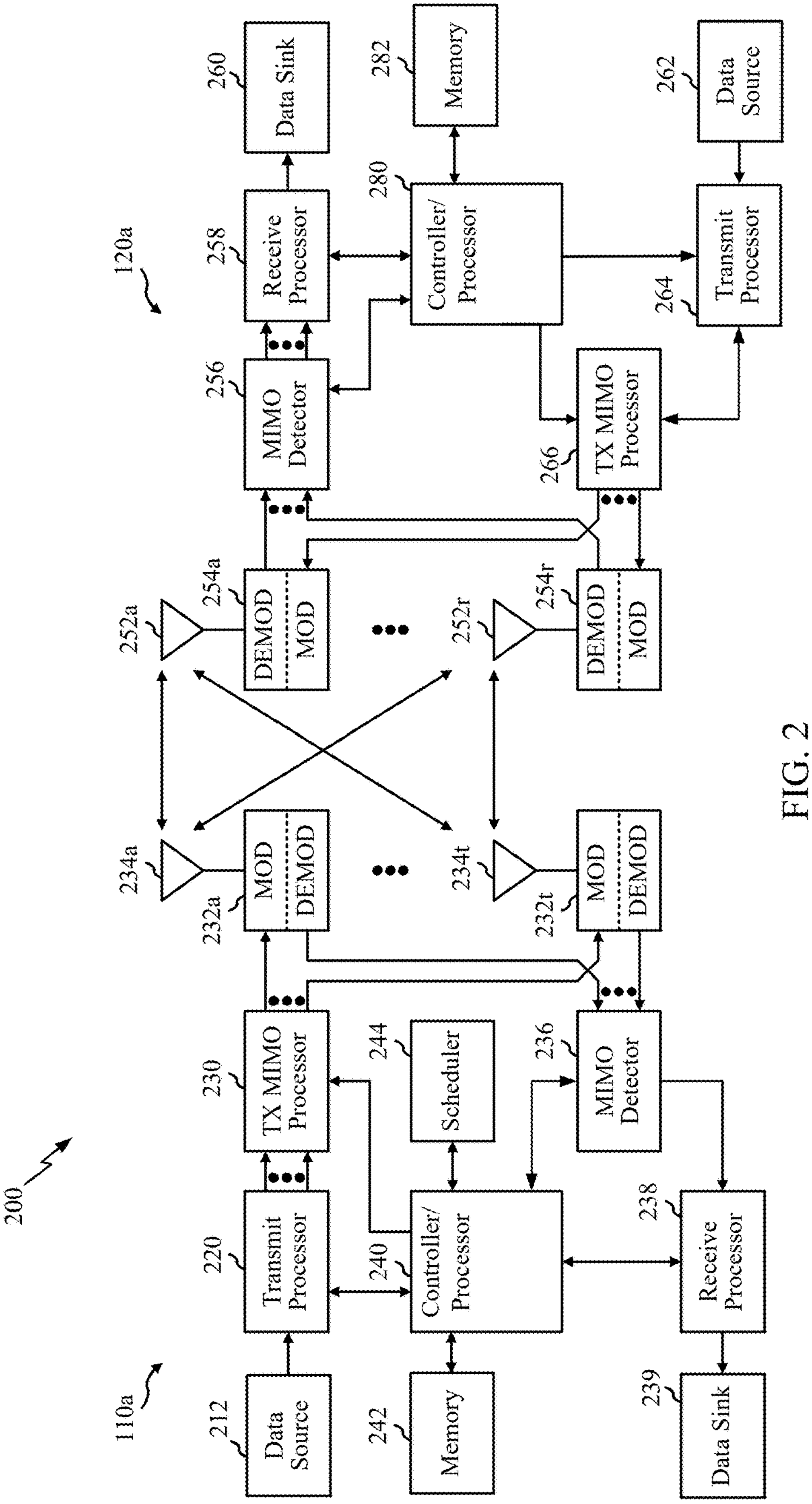
FIG. 2 is a block diagram conceptually illustrating a design of an example base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120*a* and/or antennas 234, processors 220, 230, 238, and/or controller/processor 240 of the BS 110*a* may be used to perform the various techniques and methods described herein.

In certain aspects of the present disclosure, the transceivers 232 and/or the transceivers 254 may include a digital-to-analog converter (DAC) with an adjustable resistor network, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Introduction to mmWave Wireless Communications

In wireless communications, an electromagnetic spectrum is often subdivided into various classes, bands, channels, or other features. The subdivision is often provided based on wavelength or frequency, where frequency may also be referred to as a carrier, a subcarrier, a frequency channel, a tone, or a subband.

5G networks may utilize several frequency ranges, which in some cases are defined by a standard, such as the 3$^{rd}$ Generation Partnership Project (3GPP) standards. For example, 3GPP technical standard TS 38.101 currently defines Frequency Range 1 (FR1) as including 600 MHz-6 GHz, though specific uplink and downlink allocations may fall outside of this general range. Thus, FR1 is often referred to (interchangeably) as a "sub-6 GHz" band.

Similarly, TS 38.101 currently defines Frequency Range 2 (FR2) as including 26-41 GHz, though again specific uplink and downlink allocations may fall outside of this general range. FR2, is sometimes referred to (interchangeably) as a "millimeter wave" ("mmW" or "mmWave") band, despite being different from the extremely high frequency (EHF) band (30 GHz-300 GHz) that is identified by the International Telecommunications Union (ITU) as a "millimeter wave" band because wavelengths at these frequencies are between 1 millimeter and 10 millimeters.

Communications using mmWave/near mmWave radio frequency band (e.g., 3 GHz-300 GHz) may have higher path loss and a shorter range compared to lower frequency communications. As described above with respect to FIG. 1, a base station (e.g., base station 110) configured to communicate using mmWave/near mmWave radio frequency bands may utilize beamforming with a UE (e.g., UE 120) to improve path loss and range.

Example RF Transceiver

Figure 3A:
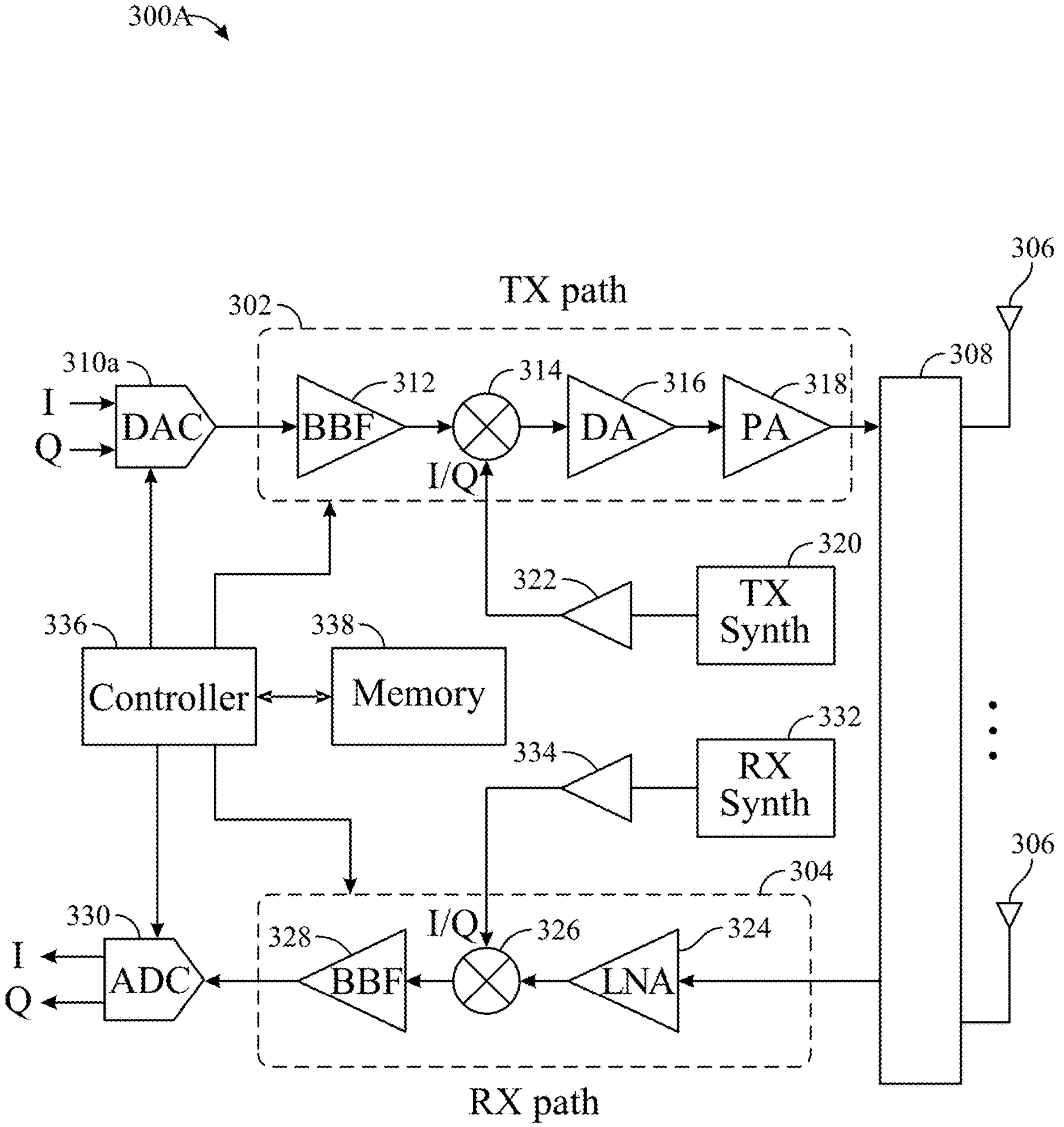
FIG. 3A is a block diagram of an example radio frequency (RF) transceiver, in which aspects of the present disclosure may be practiced.

FIG. 3A is a block diagram of an example radio frequency (RF) transceiver circuit 300A, in accordance with certain aspects of the present disclosure. The RF transceiver circuit 300A includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310*a*, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310*a* may be implemented by any of various suitable high-speed DAC topologies, such as a current-steering DAC. For certain aspects, the DAC 310*a* may be implemented with an adjustable resistor network, as described in more detail below. The BBF 312 filters the baseband signals received from the DAC 310*a*, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300A. The controller 336 and/or the memory 338 may include control logic (e.g., complementary metal-oxide-semiconductor (CMOS) logic).

Figure 3B:
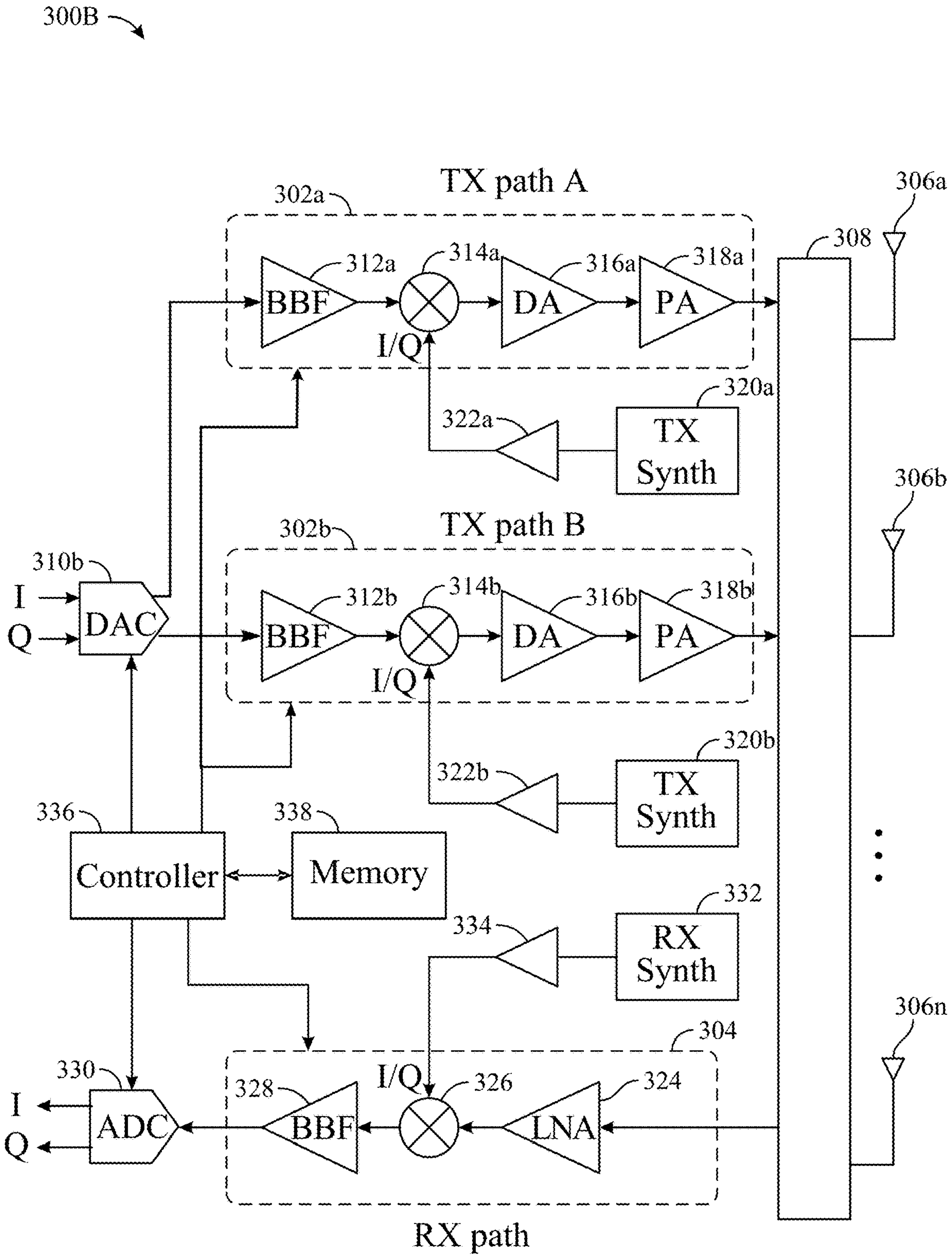
FIG. 3B is a block diagram of an example RF transceiver with multiple transmit paths, in which aspects of the present disclosure may be practiced.

FIG. 3B is a block diagram of an example RF transceiver circuit 300B, in accordance with certain aspects of the present disclosure. The RF transceiver circuit 300B may be similar to the RF transceiver circuit 300A, but with multiple TX paths 302*a* and 302*b* (collectively referred to as "TX paths 302"). The TX path 302*a* may include a baseband filter (BBF) 312*a*, a mixer 314*a*, a driver amplifier (DA) 316*a*, and a power amplifier (PA) 318*a*. The TX path 302*b* may include similar components as the TX path 302*a* (e.g., a BBF 312*b*, a mixer 314*b*, a DA 316*b*, and a PA 318*b*). The components of the TX path 302*a* may be the same as or different than the components of the TX path 302*b*. The RF transceiver circuit 300B may also include a DAC 310*b* for supporting multiple radio access technologies (RATs), such as sub-6 GHz and mmWave transmissions.

The RF transceiver circuit 300B (and more specifically, the DAC 310*b* and TX paths 302) may support multiple radio transmission scenarios, such as for sub-6 GHz and millimeter wave (mmWave) radio transmission scenarios. For example, the RF transceiver circuit 300B may transmit signals using a first wireless communication technology operating at or below 6 GHz (e.g., 3G, 4G, 5G, etc.) and a second wireless communication technology operating above 6 GHz (e.g., mmWave 5G NR in 24 to 60 GHz bands, IEEE 802.11ad or 802.11ay). In one example, the RF transceiver circuit 300B may process sub-6 GHz signals through the TX path 302*a*, and may process mmWave signals through the TX path 302*b* (or vice versa). As used herein, sub-6 GHz bands may include frequency bands of 300 to 6000 MHz in some examples, and may include bands in the 6000 MHz and/or 7000 MHz range in some examples.

In some cases where the DAC 310*b* supports both sub-6 GHz and mmWave frequency ranges and utilizes a current-steering DAC topology, the DAC 310*b* may be referred to as a "converged current-steering DAC." In converged current-steering DACs, a wide range of full-scale current ($I_{FS}$) is desirable due to different $I_{FS}$ specifications for baseband filters at the different outputs of the DAC 310*b* (e.g., BBF 312*a* and 312*b*). In some examples, the DAC 310*b* supports an $I_{FS}$ equal to a base value (e.g., x or 1x) for sub-6 GHz technology, and an $I_{FS}$ equal to two to four times the base value (e.g., 2x or 4x) for mmWave technology. In some examples, an $I_{FS}$ equal to eight times the base value (e.g., 8x) may be desirable. For example, if an $I_{FS}$ has a base value 1x=0.25 mA for sub-6 GHz, the $I_{FS}$ may equal be equal to 0.50 or 1.00 mA for mmWave. Although shown as single-ended outputs, each output of the DAC 310*b* illustrated in FIG. 3B may represent a differential output current.

While FIGS. 1, 2, 3A, and 3B provide a wireless communication as an example application in which certain aspects of the present disclosure may be implemented to facilitate understanding, certain aspects described herein may be used for digital-to-analog conversion in any of various other suitable systems (e.g., an audio system or other electronic system).

Example DAC with Adaptive Resistor Network

Current-steering digital-to-analog converters (DACs) are one example architecture for high performance digital-to-analog conversion in many wireless transmitters. One type of current-steering DAC is a resistor degeneration (R-deg) current-steering DAC. Compared to some other DAC architectures, R-deg current-steering DACs may offer reduced flicker noise, mismatch drift over temperature changes, gate leakage, and lateral area (e.g., footprint).

Figure 4A:
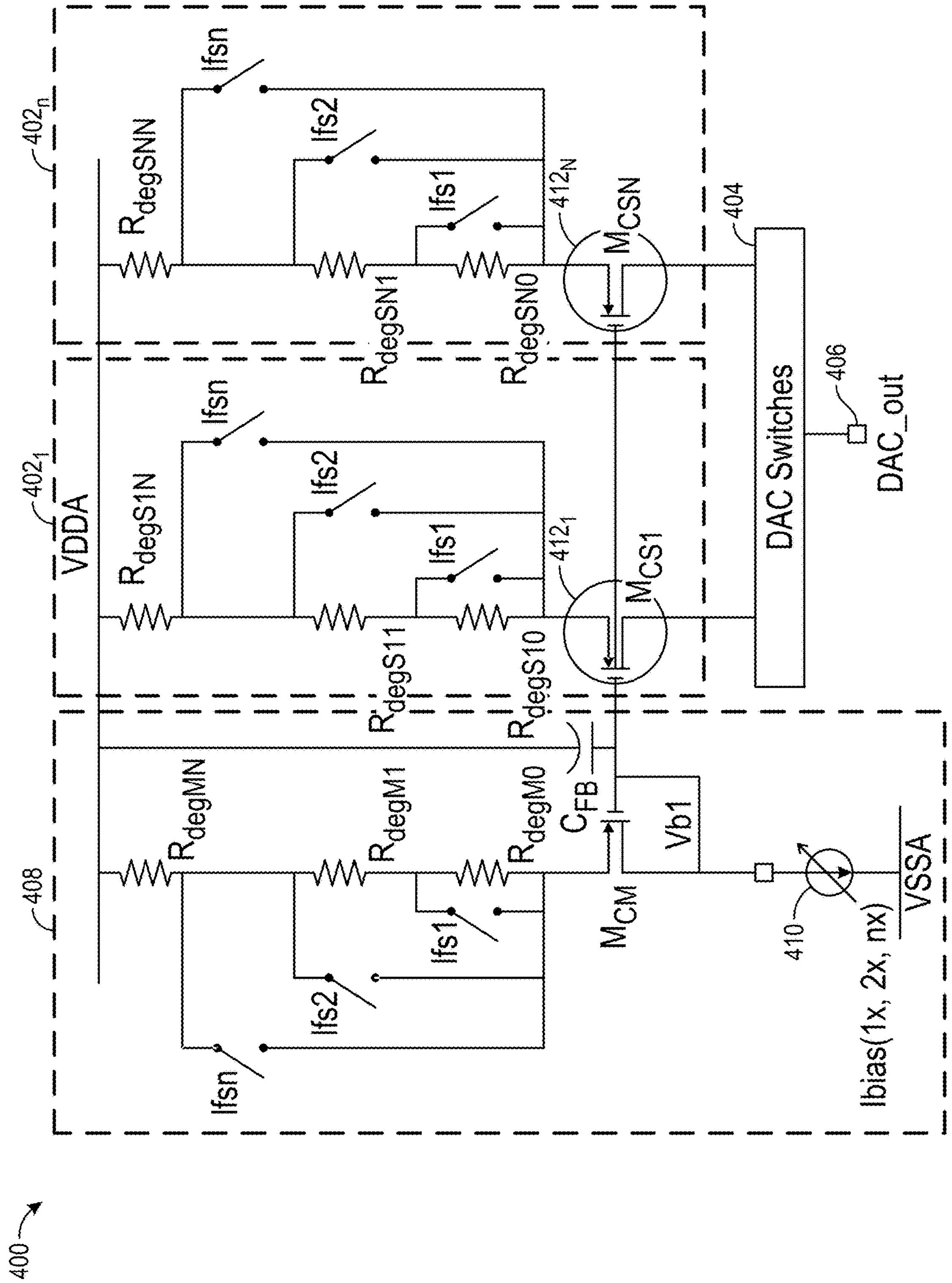
FIG. 4A is a schematic diagram of an example digital-to-analog converter (DAC) with a resistor network having an adjustable resistance, in accordance with certain aspects of the present disclosure.

FIG. 4A illustrates an example DAC 400 (e.g., which may implement the DAC 310*a* of FIG. 3A or DAC 310*b* of FIG. 3B). The core of the DAC 400 includes a number n of DAC cells $\mathbf{402}_1$ through $\mathbf{402}_n$ (referred to collectively as "DAC cells 402" and individually as a "DAC cell 402"), where n is an integer greater than one. Each DAC cell 402 may include at least one current source $\mathbf{412}_1, \ldots, \mathbf{412}_N$ (referred to collectively as "current sources 412" and individually as a "current source 412") and a resistor network coupled between a power supply rail (e.g., VDDA) and the current source, thereby providing a degeneration resistance.

Each of the resistor networks may include a plurality of resistive elements. For example, the DAC cell $\mathbf{402}_1$ includes N+1 degeneration resistive elements $R_{degS10}$, $R_{degS11}$, . . . , $R_{degS1N}$, and the n DAC cell $\mathbf{402}_n$ includes N+1 degeneration resistive elements $R_{degSN0}$, $R_{degSN1}$, . . . , $R_{degSNN}$. For ease of description, the resistive elements of a resistor network may be referred to collectively as "resistive elements $R_{deg}$" or individually as "a resistive element $R_{deg}$." As shown, in certain aspects, the resistive elements $R_{deg}$ of a DAC cell 402 may be coupled in series. In some examples, the nodes between the resistive elements $R_{deg}$ may be referred to as "taps" of the resistor network.

Each of the current sources 412 may be implemented by at least one transistor (e.g., transistors $M_{CS1}$, . . . , $M_{CSN}$; collectively referred to as "transistors $M_{CS}$"), such as a p-type metal-oxide-semiconductor (PMOS) transistor as illustrated in FIG. 4A.

The DAC 400 may also include a plurality of DAC switches 404 coupled between the current sources 412 and an output 406 (labeled "DAC_out") of the DAC 400. Depending on a digital input signal provided to an input of the DAC 400, each bit of the DAC 400 associated with a DAC cell 402 may control that respective cell's switch 404

(or that respective cell's differential switches) to source or block a current from the cell's current source 412 to the DAC output 406. The sourced currents from the individual DAC cells 402 may be combined (e.g., using current summation) to provide the analog output signal at the DAC output 406. The DAC output 406 may be coupled to one or more baseband filters (e.g., the BBF(s) 312 of FIG. 3A or 3B) or any of various other suitable circuits. Although shown as a single-ended output in FIG. 4A, the DAC output 406 may be implemented as a pair of differential current outputs.

The DAC 400 may also include a bias branch 408 (also referred to as a "reference branch" of a current mirror, where the bias branch 408 has a reference current source and where the current sources 412 in the DAC cells 402 are controlled based on the reference current). The bias branch 408 may be configured to control the current of the current source(s) 412 in the one or more DAC cells 402. The bias branch 408 may include a replica DAC cell with a current mirror transistor $M_{CM}$ and a resistor network coupled between the power supply rail and the current mirror transistor $M_{CM}$. The bias branch 408 may also include a tunable bias current source 410 (for generating a bias current Ibias) coupled between a drain (shorted to a gate) of transistor $M_{CM}$ (and control inputs of the current sources 412 (e.g., gates of the transistors $M_{CS}$) in the one or more of the DAC cells 402) and a reference potential node (e.g., an analog ground, labeled "VSSA" in FIG. 4A). The bias current source 410 may be configured to generate a bias current with a value equal to a base value (e.g., 1x) or a multiple of the base value (e.g., 2x, 3x, 4x, . . . , nx). The bias branch 408 may also include a capacitive element (labeled "$C_{FB}$") coupled between the power supply rail (VDDA) and the control input of transistor $M_{CM}$ (and the control inputs of the current sources 412 in the one or more of the DAC cells 402). This capacitive element $C_{FB}$ may provide noise filtering, for example.

The degeneration voltage of a DAC cell 402 may be defined as the voltage drop (e.g., current-resistance (IR) drop) across the resistor network (e.g., between the power supply rail (VDDA) and the current source 412). The full-scale current ($I_{FS}$) of the DAC 400 may be defined as the sum of the currents generated by the current sources 412. The $I_{FS}$ may be controlled by the bias current source 410. The size of the current sources 412 may be selected based on a maximum $I_{FS}$ of the DAC 400. When the DAC 400 operates at the maximum $I_{FS}$, the degeneration voltage is also at a maximum value. However, when the DAC 400 operates at a nominal $I_{FS}$ (for example, less than one-half of the maximum $I_{FS}$), the degeneration voltage of the DAC cells 402 will be reduced. Current noise and mismatch are inversely proportional to the degeneration voltage of the DAC cells 402. Accordingly, as a result of the lower degeneration voltage, the DAC 400 may suffer from increased noise and mismatch. Moreover, it may be difficult to scale up the $I_{FS}$ in traditional current-steering DAC architectures since the degeneration voltage of a DAC cell 402 is scaled linearly with the current generated by the current source 412 in that DAC cell 402 and the power supply rail voltage may be limited.

Accordingly, what is desired are apparatus and techniques for maintaining the degeneration voltage at (or at least near) the maximum value, even when the DAC operates at a nominal $I_{FS}$. Certain aspects of the present disclosure provide techniques and circuitry for adaptively adjusting a resistance of the resistor network in the DAC based on the bias current. With the adjustable resistance, the degeneration voltage may be maximized (or at least increased) for a given value of the bias current (and a given headroom). The higher degeneration voltage may provide reduced output noise and mismatch.

Therefore, FIG. 4A also illustrates an example implementation of a resistor network with an adjustable resistance for use in the DAC 400, in accordance with certain aspects of the present disclosure. This implementation introduces a plurality of switches coupled to one or more of the resistive elements and configured to adjust the resistance of the resistor network, based on $I_{FS}$ for that particular DAC cell 402 (as set by the bias current).

The resistive elements $R_{deg}$ of the resistor network may be coupled in series, and taps of the resistor network may be located at the nodes between the resistive elements $R_{deg}$. As shown in FIG. 4A, a first switch Ifs1 in the plurality of switches may be coupled between a first tap of the resistor network (e.g., the node between $R_{degS10}$ and $R_{degS11}$) and the current source 412 of the DAC cell 402. In certain aspects, a second switch Ifs2 in the plurality of switches may be coupled between a second tap of the resistor network, different from the first tap, and the current source 412. For example, the second switch Ifs2 may be coupled between a second tap (e.g., the node between $R_{degS11}$ and another resistive element (not shown)) of the resistor network and the current source 412.

For certain aspects, at least one of the plurality of switches may be configured to be in an open state or a closed state based on a value of the bias current, as explained in more detail below.

Figure 4B:
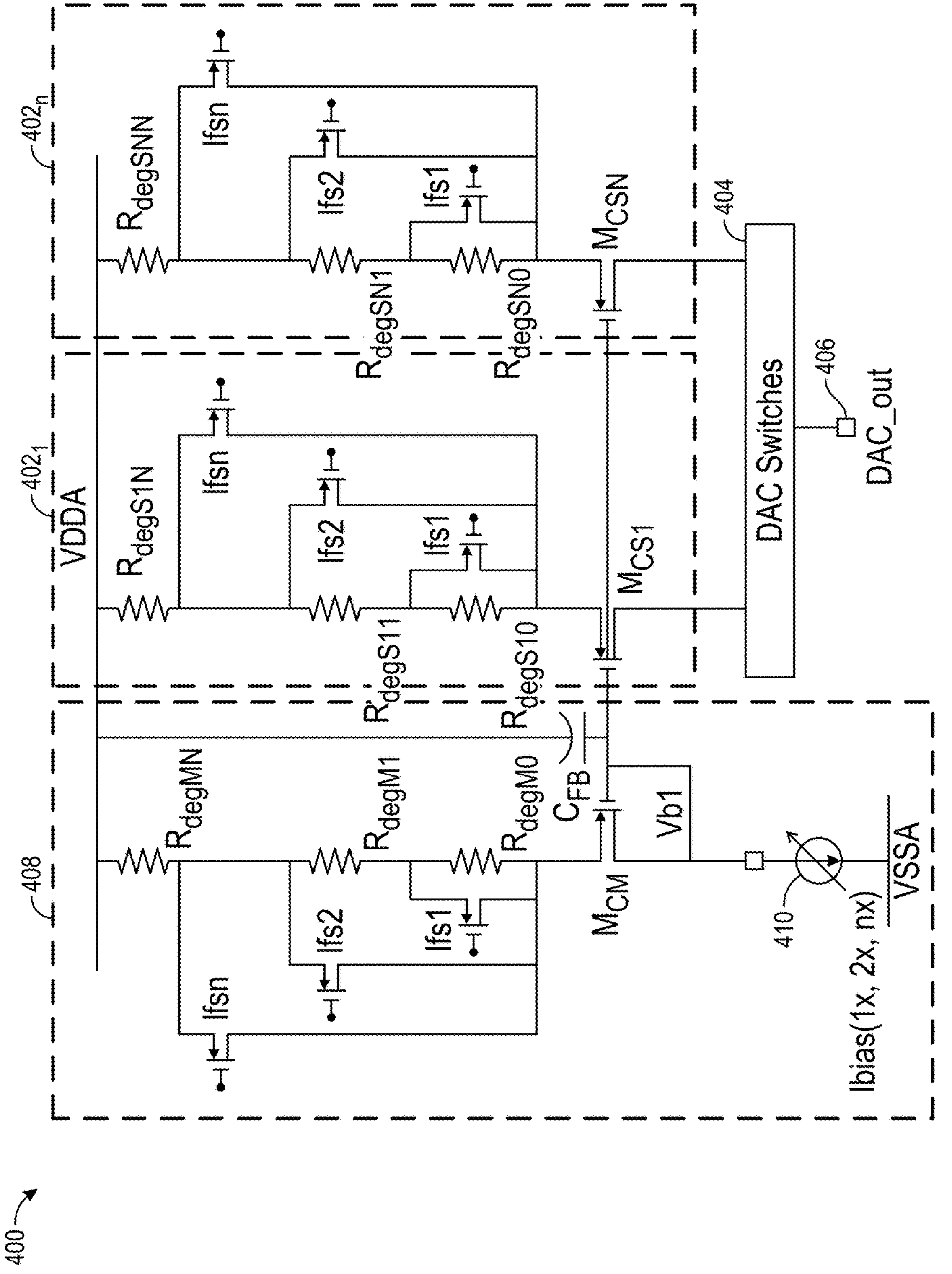
FIG. 4B is an example implementation of the DAC of FIG. 4A, in accordance with certain aspects of the present disclosure.

As shown in FIG. 4B, each of the switches may be implemented by a transistor, such as a p-channel field-effect transistor (PFET) with a negative gate-to-source voltage ($V_{gs}$). A PFET with a negative $V_{gs}$ may have low current leakage when the transistor is off. The source of each network transistor in a DAC cell 402 may be coupled to different taps of the resistor network (e.g., nodes between the resistive elements) of the respective DAC cell 402. Additionally, the drain of each network transistor in a DAC cell 402 may be coupled to the current source 412 (e.g., the source of transistor $M_{CS}$) of the respective DAC cell 402.

FIGS. 5A, 5B, 5C, and 5D are schematic diagrams illustrating alternative example circuits for implementing a resistor network with an adjustable resistance, in accordance with certain aspects of the present disclosure. For certain aspects, the resistive elements in these example circuits may have the same resistance.

Figure 5A:
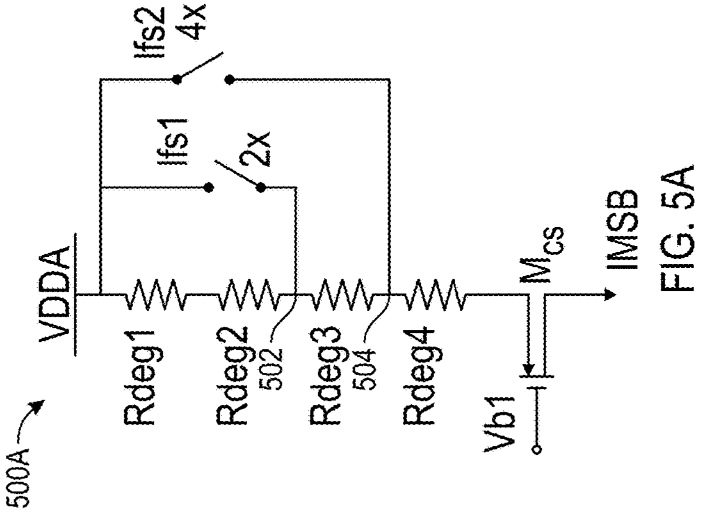
FIGS. 5A, 5B, 5C, and 5D are schematic diagrams illustrating alternative example circuits for implementing an adjustable resistor network in a DAC, in accordance with certain aspects of the present disclosure.

As shown in circuit 500A of FIG. 5A, the resistor network may be implemented by four resistive elements (labeled $R_{deg1}$, $R_{deg2}$, $R_{deg3}$, and $R_{deg4}$) coupled in series. The resistor network may be used to support a full-scale current for a particular DAC cell, where the full-scale current may be equal to one times, two times, or four times the base value (e.g., 1x, 2x, or 4x) of the bias current (Ibias). As shown, a first switch Ifs1 may be coupled between a first tap 502 (e.g., the node between resistive elements $R_{deg2}$ and $R_{deg3}$) of the resistor network and the power supply rail (e.g., VDDA), as depicted. $I_{MSB}$ is the most significant bit (MSB) current, which is basically the current output by the current source for that DAC cell. In some examples, the circuit 500A may also include a second switch Ifs2 coupled between a second tap 504 (e.g., the node between resistive elements $R_{deg3}$ and $R_{deg4}$) of the resistor network and the power supply rail.

In some examples, when the bias current is set to a value equal to the base value (e.g., 1x), the first switch Ifs1 and the second switch Ifs2 may be configured to be in an open state. In some examples, when the bias current is set to a value equal to two times the base value (e.g., 2x), the first switch Ifs1 may be configured to be in a closed state, and the second switch Ifs2 may be configured to be in an open state. In some examples, when the bias current is set to a value equal to four times the base value (e.g., 4x), the second switch Ifs2 may be configured to be in a closed state, and the first switch Ifs1 may be configured to be in an open state.

Figure 5B:
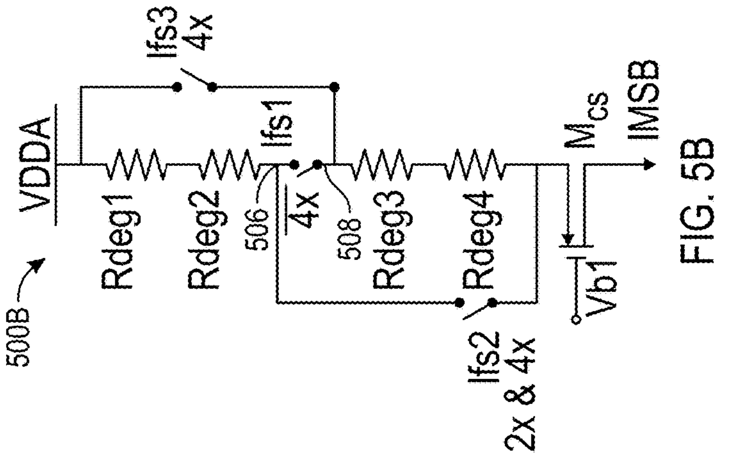

In the alternative circuit 500B of FIG. 5B, for example, a first portion of the plurality of resistive elements (e.g., $R_{deg1}$ and $R_{deg2}$ coupled in series) may be selectively coupled, by a first switch Ifs1 in the plurality of switches, to a second portion of the plurality of resistive elements (e.g., $R_{deg3}$ and $R_{deg4}$ coupled in series). In other words, the first switch Ifs1 selectively couples a terminal of resistive element $R_{deg2}$ to a terminal of resistive element $R_{deg3}$. In some examples, a second switch Ifs2 may be coupled between a first tap 506 of the resistor network (the terminal of resistive element $R_{deg2}$) and the source of transistor $M_{CS}$, as shown. In some examples, a third switch Ifs3 may be coupled between a second tap 508 of the resistor network (the terminal of resistive element $R_{deg3}$) and the power supply rail, as shown.

In certain aspects, when the bias current is set to a value equal to the base value (e.g., 1x), the first switch Ifs1 may be configured to be in a closed state, and the second switch Ifs2 and the third switch Ifs3 may be configured to be in an open state. In certain aspects, when the bias current is set to a value equal to two times the base value (e.g., 2x), the first switch Ifs1 and the second switch Ifs2 may be configured to be in a closed state, and the third switch Ifs3 may be configured to be in an open state. In some examples, when the bias current is set to a value equal to four times the base value (e.g., 4x), the second switch Ifs2 and the third switch Ifs3 may be configured to be in a closed state, and the first switch Ifs1 may be configured to be in an open state (as indicated by the label "$\overline{4x}$").

Figure 5C:
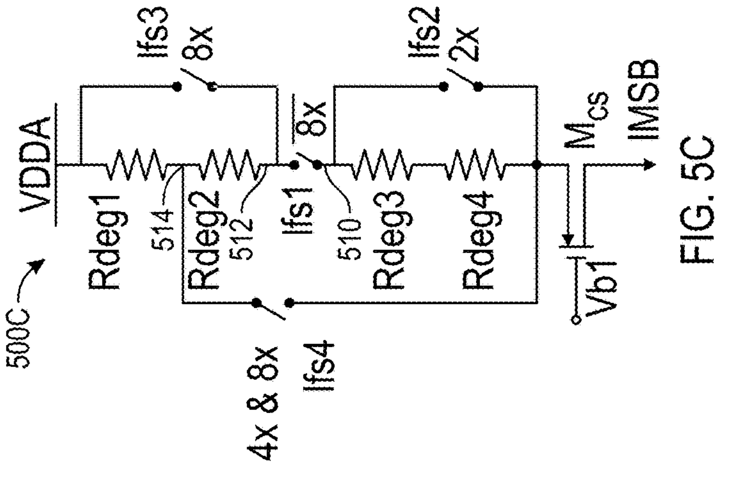
Figure 5D:
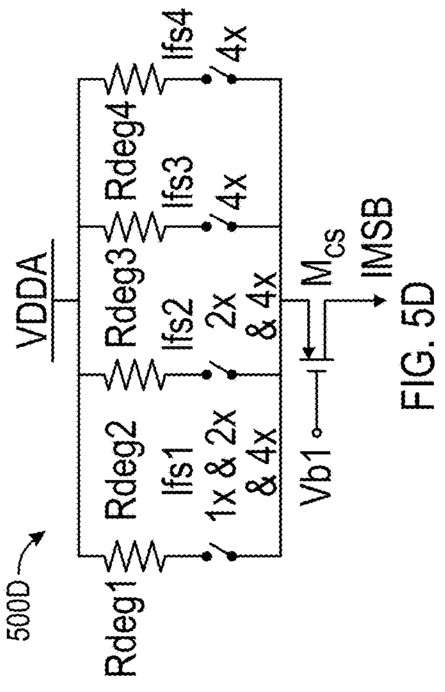

In the alternative circuit 500C of FIG. 5C, for example, a first portion of the plurality of resistive elements (e.g., $R_{deg1}$ and $R_{deg2}$ coupled in series) may be selectively coupled, by a first switch Ifs1 in the plurality of switches, to a second portion of the plurality of resistive elements (e.g., $R_{deg3}$ and $R_{deg4}$ coupled in series). In other words, the first switch Ifs1 selectively couples a terminal of resistive element $R_{deg2}$ to a terminal of resistive element $R_{deg3}$. In some examples, the alternative circuit 500C may also include a second switch Ifs2 coupled between a first tap 510 of the resistor network (the terminal of resistive element $R_{deg3}$) and the source of transistor $M_{CS}$, as shown. In some examples, the alternative circuit 500C may also include a third switch Ifs3 coupled between a second tap 512 of the resistor network (the terminal of resistive element $R_{deg2}$) and the power supply rail, as shown. In some examples, the alternative circuit 500C may also include a fourth switch Ifs4 coupled between a third tap 514 of the resistor network (a terminal of resistive element $R_{deg1}$) and the source of transistor $M_{CS}$, as shown.

In certain aspects, when the bias current is set to a value equal to the base value (e.g., 1x), the first switch Ifs1 may be configured to be in a closed state, and the second switch Ifs2, the third switch Ifs3, and the fourth switch Ifs4 may be configured to be in an open state. In certain aspects, when the bias current is set to a value equal to two times the base value (e.g., 2x), the first switch Ifs1 and the second switch Ifs2 may be configured to be in a closed state, and the third switch Ifs3 and the fourth switch Ifs4 may be configured to be in an open state. In some examples, when the bias current is set to a value equal to four times the base value (e.g., 4x), the first switch Ifs1 and the fourth switch Ifs4 may be configured to be in a closed state, and the second switch Ifs2 and the third switch Ifs3 may be configured to be in an open state. In some examples, when the bias current is set to a value equal to eight times the base value (e.g., 8x), the third switch Ifs3 and the fourth switch Ifs4 may be configured to be in a closed state, the first switch Ifs1 may be configured to be in an open state (as indicated by the label "$\overline{8x}$") and the second switch Ifs2 may also be configured to be in an open state.

In certain aspects, each of the switches in the plurality of switches may be coupled between the current source (e.g., the source of transistor $M_{CS}$) and a different resistive element of the plurality of resistive elements, which are selectively coupled in parallel. For example, the alternative circuit 500D of FIG. 5D may include a first switch Ifs1 coupled between a first resistive element $R_{deg1}$ and the current source. In some examples, the alternative circuit 500D may also include a second switch Ifs2 coupled between a second resistive element $R_{deg2}$ and the current source. In some examples, the alternative circuit 500D may also include a third switch Ifs3 coupled between a third resistive element $R_{deg3}$ and the current source, and a fourth switch Ifs4 coupled between a fourth resistive element $R_{deg4}$ and the current source.

In the case of the alternative circuit 500D, when a set of switches are in a closed state, the resistive elements coupled to the set of switches will be coupled in parallel with each other. In certain aspects, when the bias current is set to a value equal to the base value (e.g., 1x), the first switch Ifs1 may be configured to be in a closed state, and the second, third, and fourth switches may be configured to be in an open state. In certain aspects, when the bias current is set to a value equal to two times the base value (e.g., 2x), the first switch Ifs1 and the second switch Ifs2 may be configured to be in a closed state, and the third switch Ifs3 and the fourth switch Ifs4 may be configured to be in an open state. In some examples, when the bias current is set to a value equal to four times the base value (e.g., 4x), all of the switches Ifs1-Ifs4 may be configured to be in a closed state. In this manner, if all four resistive elements have the same resistance, the degeneration voltage Vdeg will be the same in all three configurations (depending on resistor tolerance).

Although a specific number of resistive elements and switches are illustrated in FIGS. 5A-5D, it should be understood that more or fewer resistive elements and/or switches may be used.

Example Techniques for Increased Full-Scale Current ($I_{FS}$)

As a brute force solution to increase the full-scale current ($I_{FS}$) of a DAC cell (e.g., from four times a base value (4x) to eight times the base value (8x)), two DAC cells including current sources may be coupled in parallel and used to drive the same output. For example, the DAC cell 402$_1$ may be duplicated where the output of the DAC cell 402$_1$ and the duplicated DAC cell drive the same output providing current to the DAC switches 404. The duplicated DAC cell is added to increase the $I_{FS}$ from 4x to 8x. However, using a duplicated DAC cell increases the area of the DAC. Certain aspects of the present disclosure are directed towards techniques for increasing the $I_{FS}$ of the DAC cell with reduced area consumption as compared to conventional implementations that use duplicated DAC cells.

Figure 6:
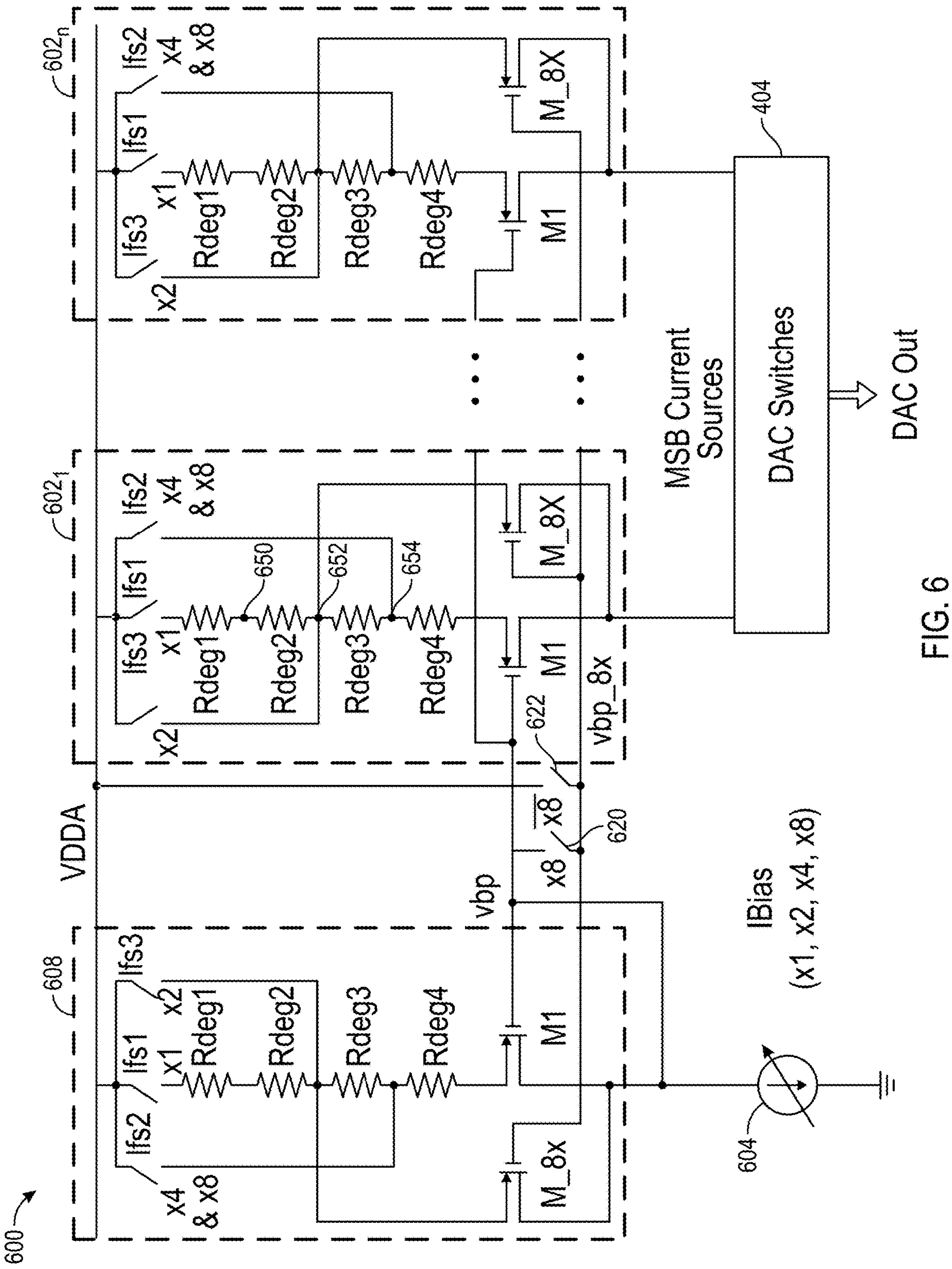
FIG. 6 illustrates an example DAC with increased full-scale current ($I_{FS}$) capability as compared to the DAC of FIG. 4A, in accordance with certain aspects of the present disclosure.

FIG. 6 illustrates a DAC 600 with increased $I_{FS}$, in accordance with certain aspects of the present disclosure. Degeneration resistive elements (e.g., labeled "$R_{deg1}$," "$R_{deg2}$," "$R_{deg3}$," and "$R_{deg4}$" and corresponding to "$R_{deg10}$" to "$R_{degNN}$" shown in FIG. 4A) can consume a relatively large amount of area. Therefore, it is beneficial to use the existing degeneration resistive elements to increase the $I_{FS}$ range up to 8x (or in some cases, 16x). To achieve $I_{FS}$ of 8x, a current source (e.g., PMOS transistor M_8*x*) and one or more enable switches (e.g., implemented via PMOS transistors) may be added, asp described in more detail herein.

The DAC 600 includes a bias branch 608 (e.g., corresponding to bias branch 408 of FIG. 4A) and a number n of DAC cells $602_1$ through $602_n$ (collectively referred to as "DAC cells 602"). Each of the DAC cells 602 includes degeneration resistive elements $R_{deg1}$ to $R_{deg4}$, where a node 650 is between $R_{deg1}$ and $R_{deg2}$, a node 652 is between $R_{deg2}$ and $R_{deg3}$, and a node 654 is between $R_{deg3}$ and $R_{deg4}$. As shown, each of the DAC cells 602 and the bias branch 608 includes a PMOS transistor M1 (e.g., current source) and a PMOS transistor M_8*x* (e.g., current source) used to facilitate an 8x $I_{FS}$. The gates of the M1 transistors are coupled to a PMOS bias voltage (vbp) node and the drain of transistor M1 of the bias branch 608. A current source 604 may be coupled to the drain of the transistor M1 of the bias branch 608 and used to sink a bias current (IBias) as shown.

Each of the bias branch 608 and the DAC cells 602 may include a set of switches. The bias branch 608 and the DAC cells 602 may have a similar circuit structure as shown. A switch Ifs1 in each of the bias branch 608 and the DAC cells 602 may be coupled between VDDA and $R_{deg1}$. A switch Ifs2 may be coupled between VDDA and the node 654 between $R_{deg3}$ and $R_{deg4}$, and a switch Ifs3 may be coupled between VDDA and the node 652 between $R_{deg2}$ and $R_{deg3}$. The switches Ifs1 of the bias branch 608 and DAC cells 602 may be closed (with other switches open) when operating with an $I_{FS}$ of a base value (e.g., also referred to herein as "1x" or "x1"), providing four resistive elements ($R_{deg1}$ to $R_{deg4}$) connected in series in the $I_{FS}$ path between VDDA and the DAC switches 404. The switches Ifs3 may be closed (with other switches open) when operating with an $I_{FS}$ of two times the base value (e.g., also referred to herein as "2x" or "x2"), shorting out two resistive elements ($R_{deg1}$ and $R_{deg2}$) and effectively providing two resistive elements ($R_{deg3}$ and $R_{deg4}$) connected in series in the $I_{FS}$ path. The switches Ifs2 may be closed (with other switches open) when operating with an $I_{FS}$ of four times the base value (e.g., also referred to herein as "4x" or "x4"), shorting out three resistive elements ($R_{deg1}$, $R_{deg2}$, and $R_{deg3}$) and effectively providing one resistive element ($R_{deg4}$) in the $I_{FS}$ path.

A switch 620 may be coupled between the vbp node and a vbp_8*x* node coupled to gates of PMOS transistors M_8*x*. To operate with an $I_{FS}$ of eight times the base value (e.g., also referred to as "8x" or "x8"), the switches Ifs2 may be closed. Moreover, the transistors M1 and M_8*x* may be turned on by closing switch 620 to couple the gate of transistor M_8*x* to the vbp node, providing the same bias voltage to the gates of transistors M1 and M_8*x*.

Figure 7:
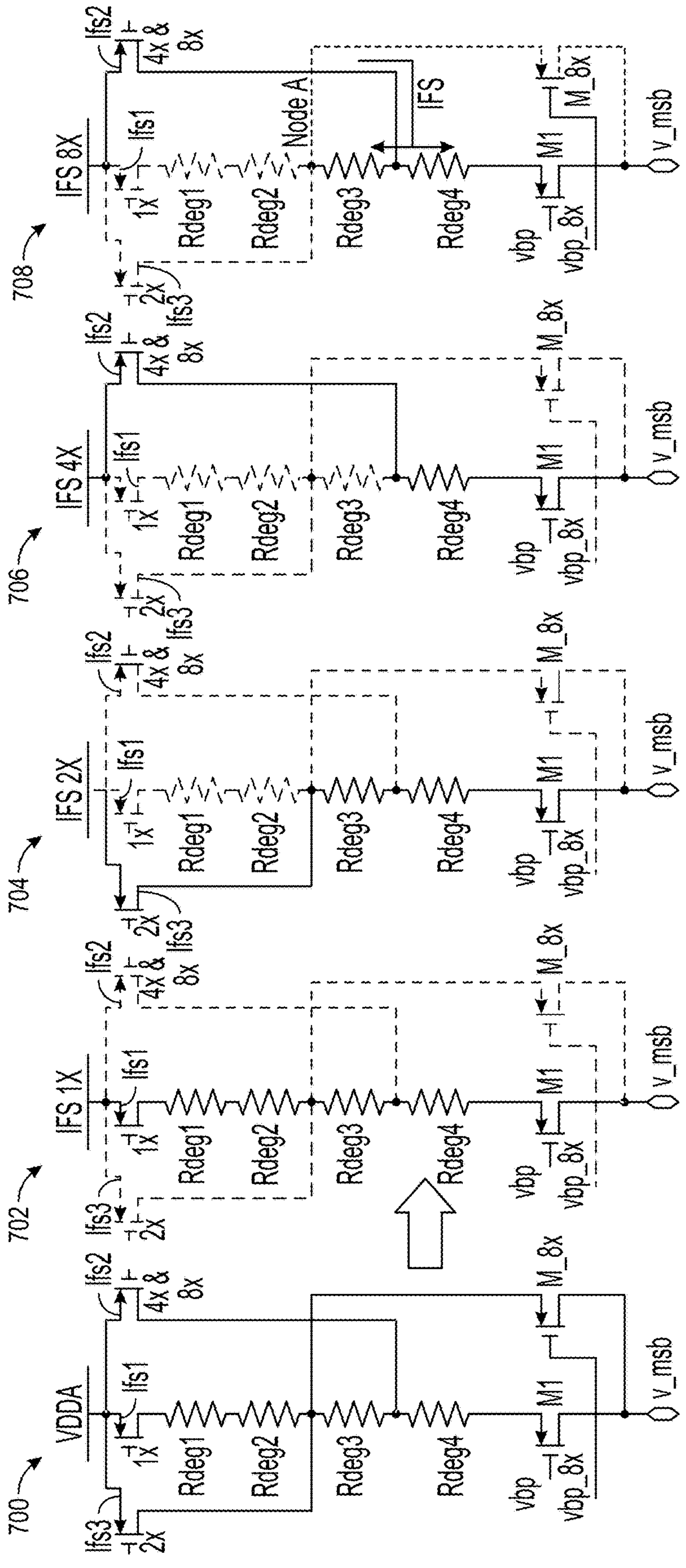
FIG. 7 illustrates the DAC cell of FIG. 6 operated in different $I_{FS}$ modes, in accordance with certain aspects of the present disclosure.

When operating with an $I_{FS}$ of 8x, the $I_{FS}$ flows to the node (e.g., node 654) between $R_{deg3}$ and $R_{deg4}$, and splits with a part (e.g., half) of the current flowing across $R_{deg3}$ and a part (e.g., half) of the current flowing across $R_{deg4}$, as described in more detail herein with respect to FIG. 7. In effect, $R_{deg3}$ and $R_{deg4}$ are in parallel providing a degeneration resistance for the 8x $I_{FS}$ that is equal to $R_{deg3}$ in parallel with $R_{deg4}$.

As shown, a switch 622 may be coupled between VDDA and the vbp_8*x* node. When not operating with an $I_{FS}$ of 8x, the switch 622 may be closed, coupling the gate of the transistors M_8*x* to VDDA to turn off the transistors M_8*x*. Thus, when operating with an $I_{FS}$ of 1x to 4x, the vbp_8*x* node is coupled to VDDA, keeping the transistors M_8*x* off. When operating with an $I_{FS}$ of 8x, the vbp_8*x* node is shorted to the vbp node to turn on the transistors M_8*x*. Thus, when operating with an $I_{FS}$ of 8x, the transistors M1 and M_8*x* are turned on and operate as current sources, allowing the effective voltage (Veff) (e.g., the gate-to-source voltage ($V_{gs}$) minus the threshold voltage ($V_{th}$)) of the transistors to be similar to the Veff of the transistors when operating with an $I_{FS}$ of 4x, keeping the transistors in saturation.

FIG. 7 illustrates a DAC cell 700 operated in different $I_{FS}$ modes, in accordance with certain aspects of the present disclosure. The DAC cell 700 may represent any one of the DAC cells 602. The bias branch 608 of FIG. 6 may be implemented with a similar circuit structure and operated similarly to the DAC cell 700. When operating with an $I_{FS}$ of 1x, the switch Ifs1 is closed (e.g., the transistor used to implement switch fs1 is on), the switches Ifs2 and Ifs3 are open, the transistor M1 is turned on, and the transistor M_8*x* is turned off, as shown in diagram 702. As shown in diagram 704, when operating with an $I_{FS}$ of 2x, the switch Ifs3 is closed, the switches Ifs1 and Ifs2 are open, the transistor M1 is turned on, and the transistor M_8*x* is turned off. As shown in diagram 706, when operating with $I_{FS}$ of 4x, the switch Ifs2 is closed, the switches Ifs1 and Ifs3 are open, the transistor M1 is turned on, and the transistor M_8*x* is turned off. As shown in diagram 708, when operating with $I_{FS}$ of 8x, the switch Ifs2 is closed, and the switches Ifs1 and Ifs3 are open. The transistors M1 and M_8*x* are also turned on, providing the $I_{FS}$ to the node between $R_{deg3}$ and $R_{deg4}$ as shown, where the $I_{FS}$ splits with a part (e.g., half) of the current flowing across $R_{deg3}$ and a part (e.g., half) of the current flowing across $R_{deg4}$. That is, when operating with $I_{FS}$ of 8x, an additional current path is provided between VDDA and an MSB voltage (v_msb) node (e.g., at the DAC switches 404) through transistor M_8*x* connected to the node labeled "Node A," effectively placing $R_{deg3}$ and $R_{deg4}$ in parallel (e.g., providing a degeneration resistance that is half the degeneration resistance when operating with $I_{FS}$ of 4x). In this manner, the DAC's area consumption may be reduced compared to conventional implementations that use duplicate DAC cells to support $I_{FS}$ of 8x.

Figure 8:
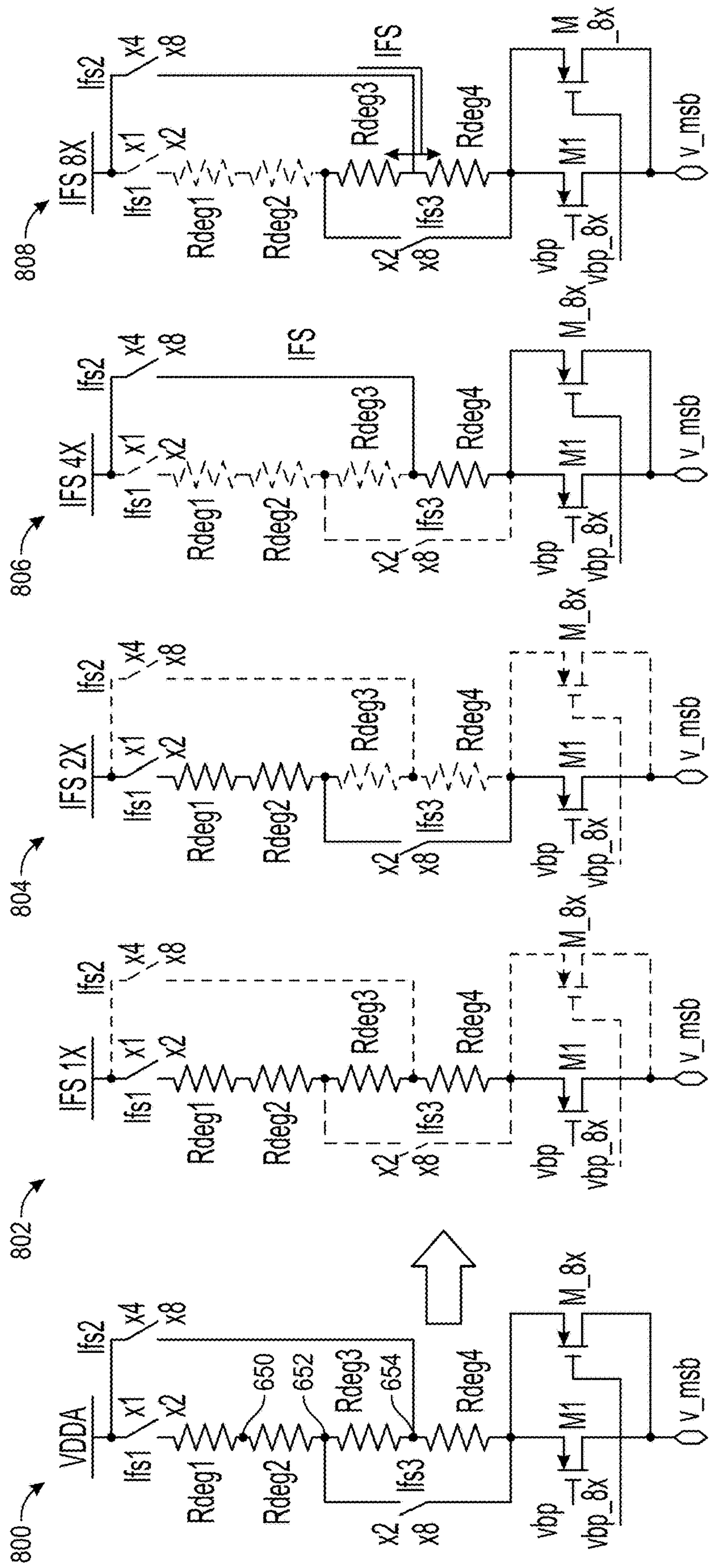
FIGS. 8-10 illustrate an example DAC cell operated in different $I_{FS}$ modes, in accordance with certain aspects of the present disclosure.

FIG. 8 illustrates a DAC cell 800 operated in different $I_{FS}$ modes, in accordance with certain aspects of the present disclosure. The DAC cell 800 is an alternative DAC cell for the circuit schemes in FIGS. 6 and 7. The DAC cell 800 may be used to implement each of multiple DAC cells (e.g., corresponding to DAC cells 602) and a bias branch (e.g., corresponding to bias branch 608). The DAC cell 800 may include a switch Ifs1 coupled between VDDA and $R_{deg1}$, a switch Ifs2 coupled between VDDA and the node 654 between $R_{deg3}$ and $R_{deg4}$, and a switch Ifs3 coupled between a source of transistors M1 and M1_8*x* and the node 652 between $R_{deg2}$ and $R_{deg3}$.

As shown in diagram 802, when operating with $I_{FS}$ of 1x, the switch Ifs1 is closed, the switches Ifs2 and Ifs3 are open, the transistor M1 is turned on, and the transistor M_8*x* is turned off, providing the $I_{FS}$ from VDDA to the v_msb node through four resistive elements $R_{deg1}$ to $R_{deg4}$ connected in series. As shown in diagram 804, when operating with $I_{FS}$ of 2x, the switches Ifs1 and Ifs3 are closed, the switch Ifs2 is open, the transistor M1 is turned on, and the transistor M_8*x* is turned off, effectively providing the $I_{FS}$ from VDDA to the v_msb node through two resistive elements $R_{deg1}$ and $R_{deg2}$ connected in series. As shown in diagram 806, when operating with $I_{FS}$ of 4x, the switch Ifs2 is closed, and the switches Ifs1 and Ifs3 are open, effectively providing the $I_{FS}$ from VDDA to the v_msb node through $R_{deg4}$. As shown in diagram 808, when operating with $I_{FS}$ of 8x, the switches Ifs2 and Ifs3 are closed, the switch Ifs1 is open, and transistors M1 and M_8x are turned on, providing a portion (e.g., half) of the $I_{FS}$ from VDDA to the v_msb node through $R_{deg3}$ and a portion (e.g., half) of the $I_{FS}$ from VDDA to the v_msb node through $R_{deg4}$. The DAC cell 800 is implemented with three switches (e.g., switches Ifs1 to Ifs3) and two current sources (e.g., transistors M1 and M_8x) to allow for the $I_{FS}$ to be programmable for 1x, 2x, 4x, and 8x. The switches Ifs1 to Ifs3 may be implemented via PMOS transistors.

Figure 9:
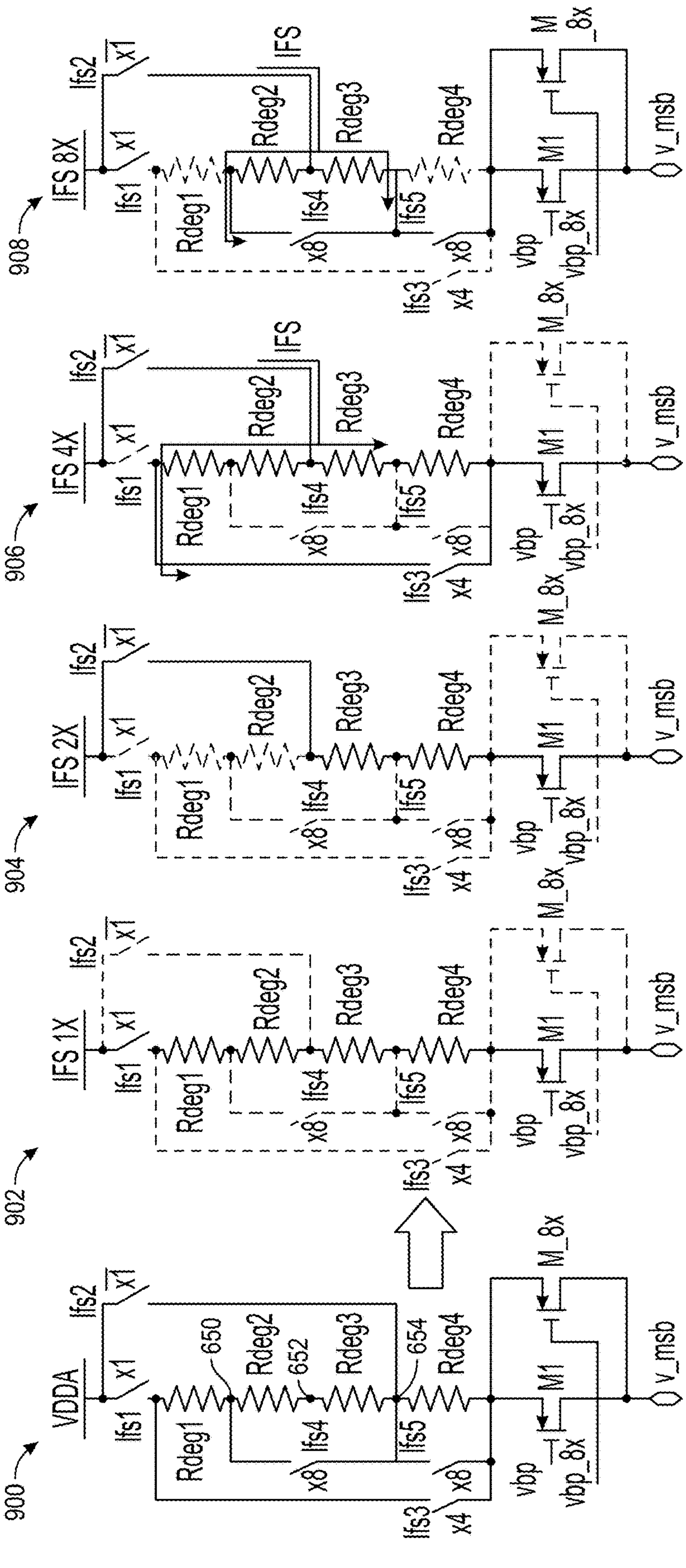

FIG. 9 illustrates a DAC cell 900 operated in different $I_{FS}$ modes, in accordance with certain aspects of the present disclosure. The DAC cell 900 is an alternative DAC cell for the circuit schemes in FIGS. 6, 7, and 8. The DAC cell 900 may be used to implement each of multiple DAC cells (e.g., corresponding to DAC cells 602) and a bias branch (e.g., corresponding to bias branch 608). The DAC cell 900 may include a switch Ifs1 between VDDA and $R_{deg1}$, a switch Ifs2 between VDDA and the node 652 between $R_{deg2}$ and $R_{deg3}$, a switch Ifs3 between switch Ifs1 and sources of transistors M1 and M_8x, a switch Ifs4 between the node 650 and the node 654, and a switch Ifs5 between the node 654 and the sources of transistors M1 and M1_8x.

As shown in diagram 902, when operating with $I_{FS}$ of 1x, switch Ifs1 is closed, and transistor M1 is turned on, providing $I_{FS}$ from VDDA to the v_msb node through $R_{deg1}$ to $R_{deg4}$. When operating with $I_{FS}$ of 2x, as shown in diagram 904, switch Ifs2 is closed, and transistor M1 is turned on, providing $I_{FS}$ from VDDA to the v_msb node through $R_{deg3}$ and $R_{deg4}$. When operating with $I_{FS}$ of 4x, switch Ifs2 is closed, switch Ifs3 is closed, and transistor M1 is turned on, providing a portion (e.g., half) of $I_{FS}$ through $R_{deg3}$ and $R_{deg4}$ and a portion (e.g., half) of $I_{FS}$ from VDDA to the v_msb node through $R_{deg2}$ and $R_{deg1}$, as shown in diagram 906. When operating with $I_{FS}$ of x8, as shown in diagram 908, switch Ifs2 is closed, switch Ifs4 is closed, switch Ifs5 is closed, and transistors M1 and M_8x are turned on, providing a portion (e.g., half) of $I_{FS}$ from VDDA to the v_msb node through $R_{deg2}$ and a portion (e.g., half) of $I_{FS}$ from VDDA to the v_msb node through $R_{deg3}$. The switches of DAC cell 900 may be implemented with PMOS transistors, for example.

Figure 10:
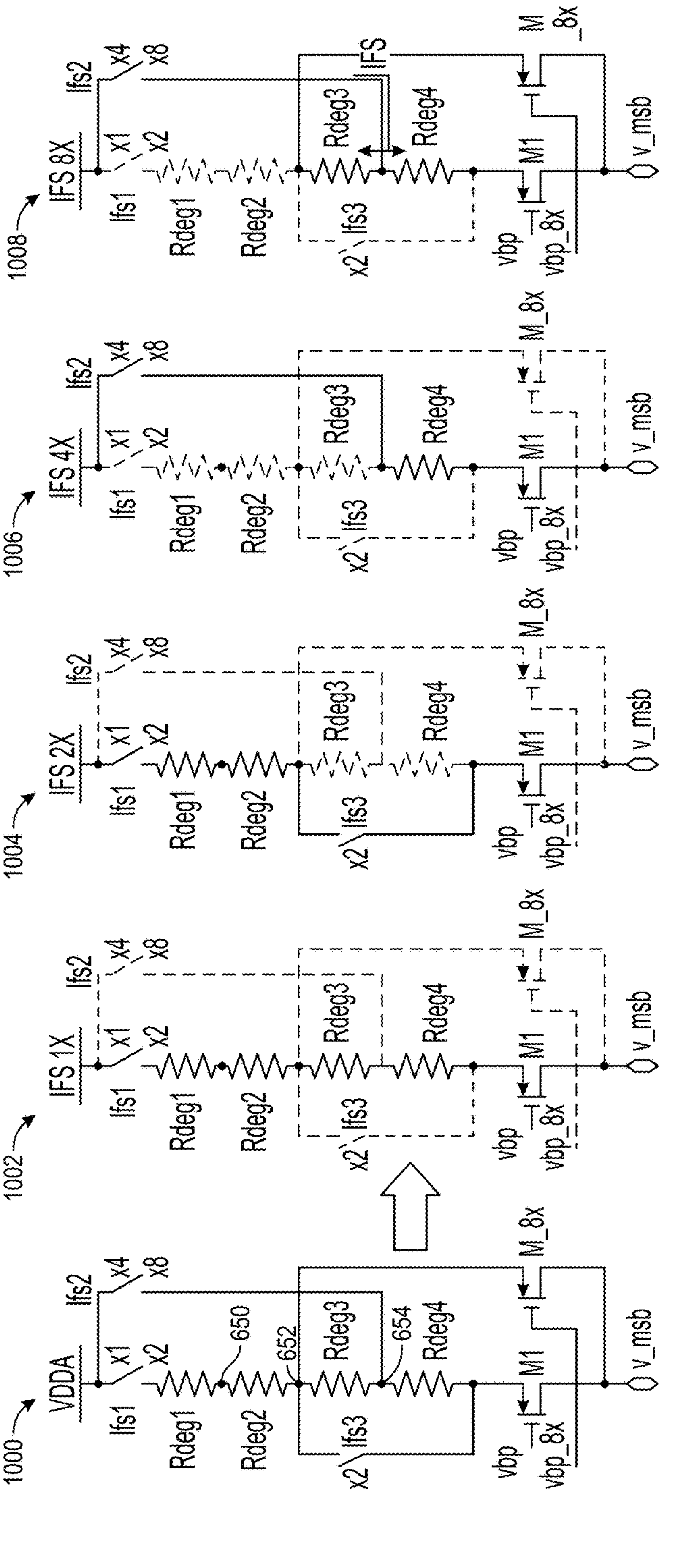

FIG. 10 illustrates an example DAC cell 1000 operated in different $I_{FS}$ modes, in accordance with certain aspects of the present disclosure. The DAC cell 1000 is an alternative DAC cell for the circuit schemes in FIGS. 6, 7, 8, and 9. The DAC cell 1000 may be used to implement each of multiple DAC cells (e.g., corresponding to DAC cells 602) and a bias branch (e.g., corresponding to bias branch 608). The DAC cell 1000 may include a switch Ifs1 between VDDA and $R_{deg1}$, a switch Ifs2 between VDDA and node 654, and a switch Ifs3 between node 652 and the source of transistor M1. As shown in diagram 1002, to provide an $I_{FS}$ of 1x, the switch Ifs1 is closed, and transistor M1 is turned on, providing $I_{FS}$ from VDDA to the v_msb node through $R_{deg1}$ to $R_{deg4}$. As shown in diagram 1004, when operating with $I_{FS}$ of 2x, switches Ifs1 and Ifs3 are closed, and transistor M1 is turned on, providing $I_{FS}$ from VDDA to the v_msb node through $R_{deg1}$ and $R_{deg2}$. As shown in diagram 1006, when operating with $I_{FS}$ of 4x, switch Ifs2 is closed, and transistor M1 is turned on, providing $I_{FS}$ from VDDA to the v_msb node through $R_{deg4}$. As shown in diagram 1008, when operating with $I_{FS}$ of 8x, switch Ifs2 is closed, and transistors M1 and M_8x are turned on, providing a portion (e.g., half) of $I_{FS}$ from VDDA to the v_msb node through $R_{deg3}$ and a portion (e.g., half) of $I_{FS}$ from VDDA to the v_msb node through $R_{deg4}$.

Figure 11A:
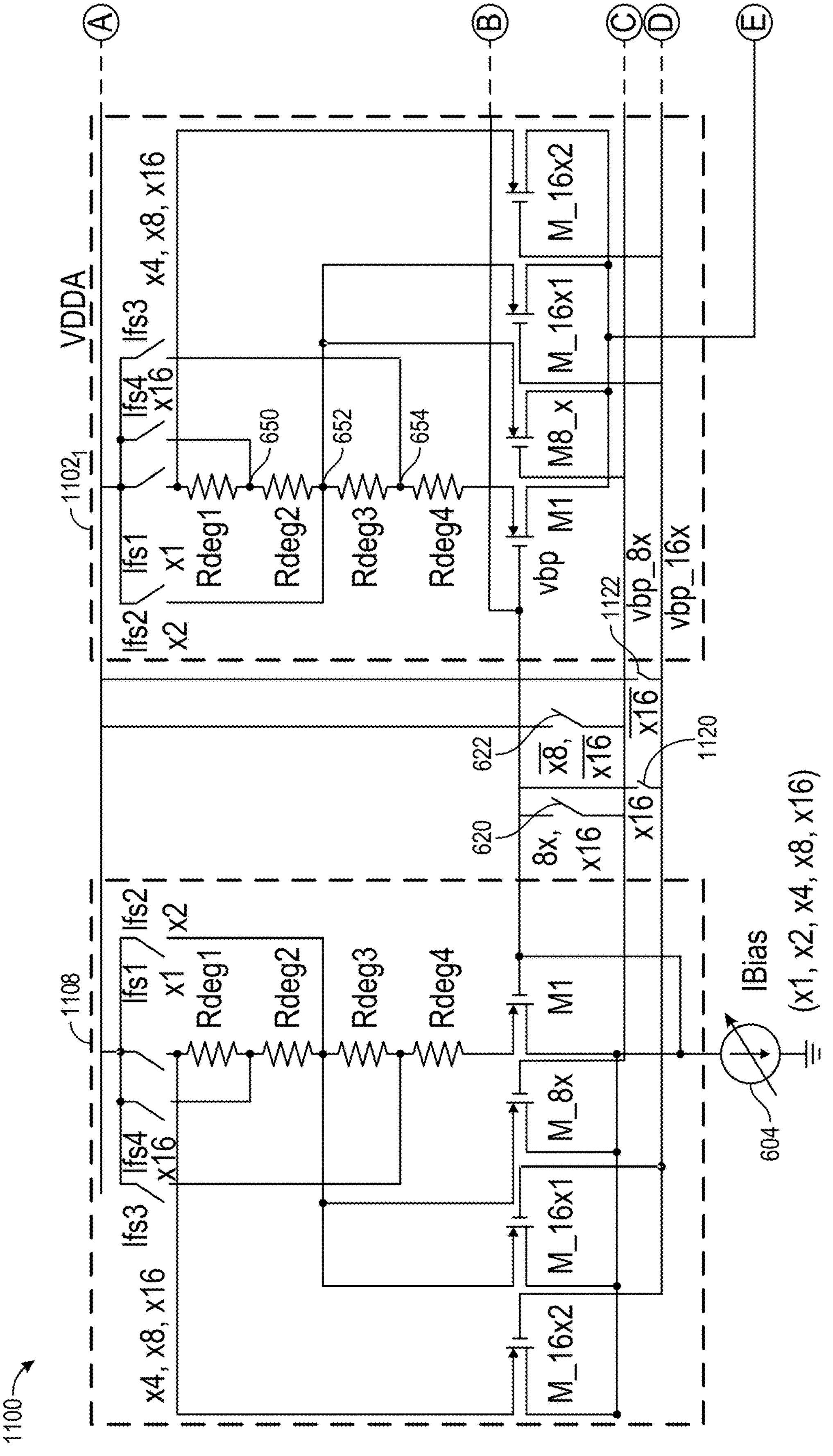
FIGS. 11A and 11B illustrate an example DAC configurable to support an $I_{FS}$ of 1×, 2×, 4×, 8×, and 16×, in accordance with certain aspects of the present disclosure.
Figure 11B:
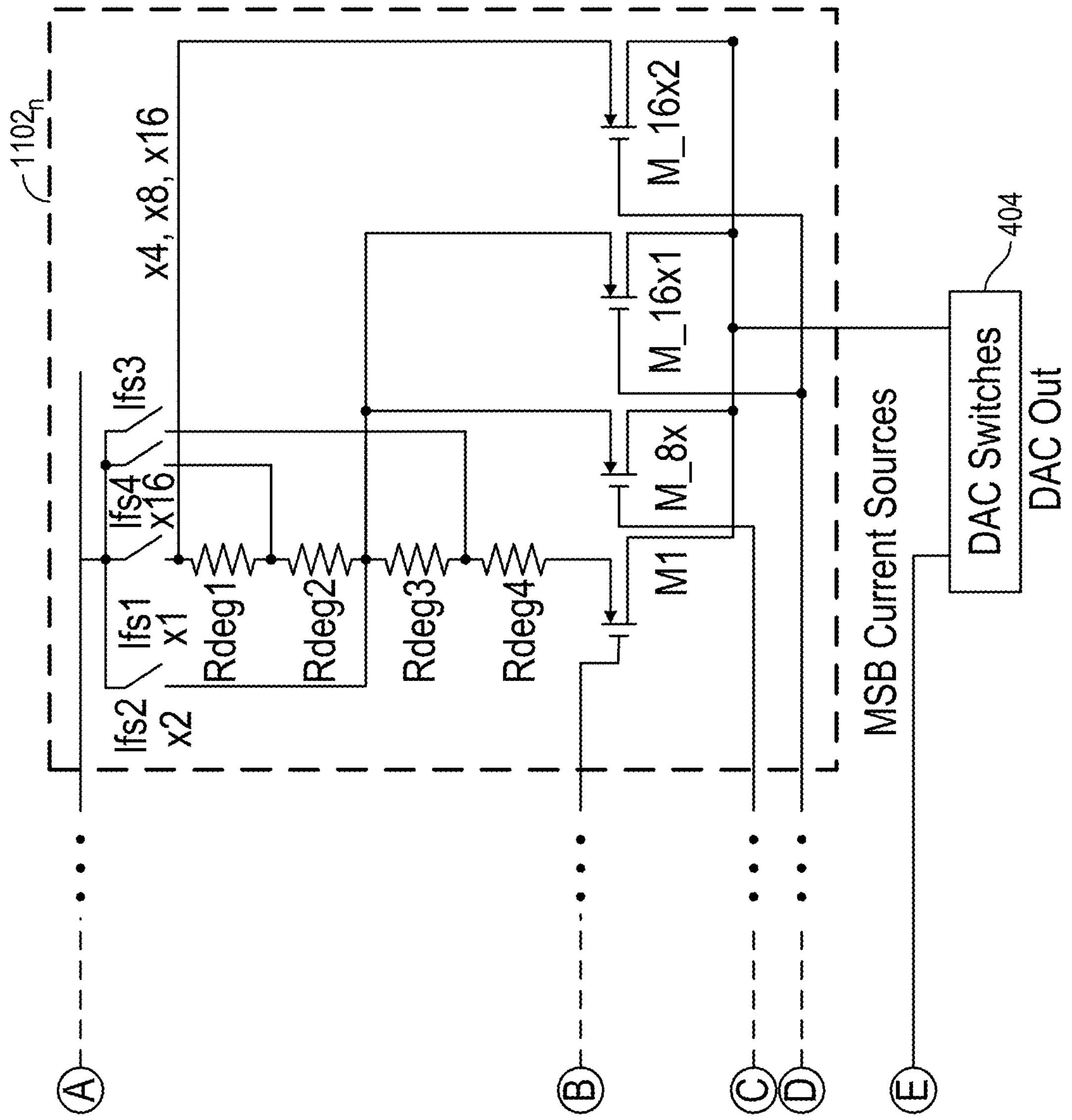

FIGS. 11A and 11B illustrate a DAC 1100 configurable to support an $I_{FS}$ of 1x, 2x, 4x, 8x, and 16x, in accordance with certain aspects of the present disclosure. As shown, the DAC 1100 includes a bias branch 1108 and DAC cells 1102$_1$ to 1102$_n$ (collectively referred to as "DAC cells 1102"). Each of the DAC cells 1102 and the bias branch 1108 may include degeneration resistive elements $R_{deg1}$ to $R_{deg4}$, as well as the transistor M1, similar to the DAC cell 602 and the bias branch 608 described with respect to FIG. 6. Each of the bias branch 1108 and DAC cells 1102 may include switches Ifs1 to Ifs4, as well as current sources implemented via a transistor M_8x for an $I_{FS}$ of 8x and transistors M_16x1 and M_16x2 for an $I_{FS}$ of 16x.

Specifically referring to DAC cell 1102$_1$, the switch Ifs1 is coupled between VDDA and $R_{deg1}$, the switch Ifs2 is coupled between VDDA and node 652, the switch Ifs3 is coupled between VDDA and node 654, and switch Ifs4 is coupled between VDDA and node 650. The DAC cell 1102$_1$ also includes the transistor M_8x having a source coupled to node 652 and a drain coupled to the DAC switches 404, a transistor M_16x1 having a source coupled to node 652 and a drain coupled to the DAC switches 404, and a transistor M_16x2 having a source coupled to switch Ifs1 and a drain coupled to the DAC switches 404. Each of the DAC cells 1102 and the bias branch 1108 may be implemented with a similar architecture as DAC cell 1102$_1$, as shown. The DAC 1100 may also include a switch 620 coupled between the Vbp node and the gates of transistors M_8x, a switch 622 coupled between VDDA and the gates of transistors M_8x, a switch 1120 coupled between the vbp node and the gates of transistors M_16x1 and M_16x2, and a switch 1122 coupled between VDDA and the gates of the transistors M_16x1 and M_16x2. To turn on transistors M_8x when operating with an $I_{FS}$ of 8x or 16x, the switch 620 may be closed, and switch 622 may be opened. To turn off transistors M_8x, the switch 620 may be opened, and the switch 622 may be closed. As shown, the gates of transistors M_16x1 and M_16x2 may be coupled to a 16x PMOS bias voltage (vbp_16x) node. To turn on transistors M_16x1 and M_16x2 when operating with an $I_{FS}$ 16x, the switch 1120 may be closed (e.g., coupling vbp_16x node to the vbp node), and the switch 1122 may be opened. To turn off the transistors M_16x1 and M_16x2, the switch 1120 may be opened, and the switch 1122 may be closed (e.g., coupling the vbp_16x node to VDDA).

Figure 12A:
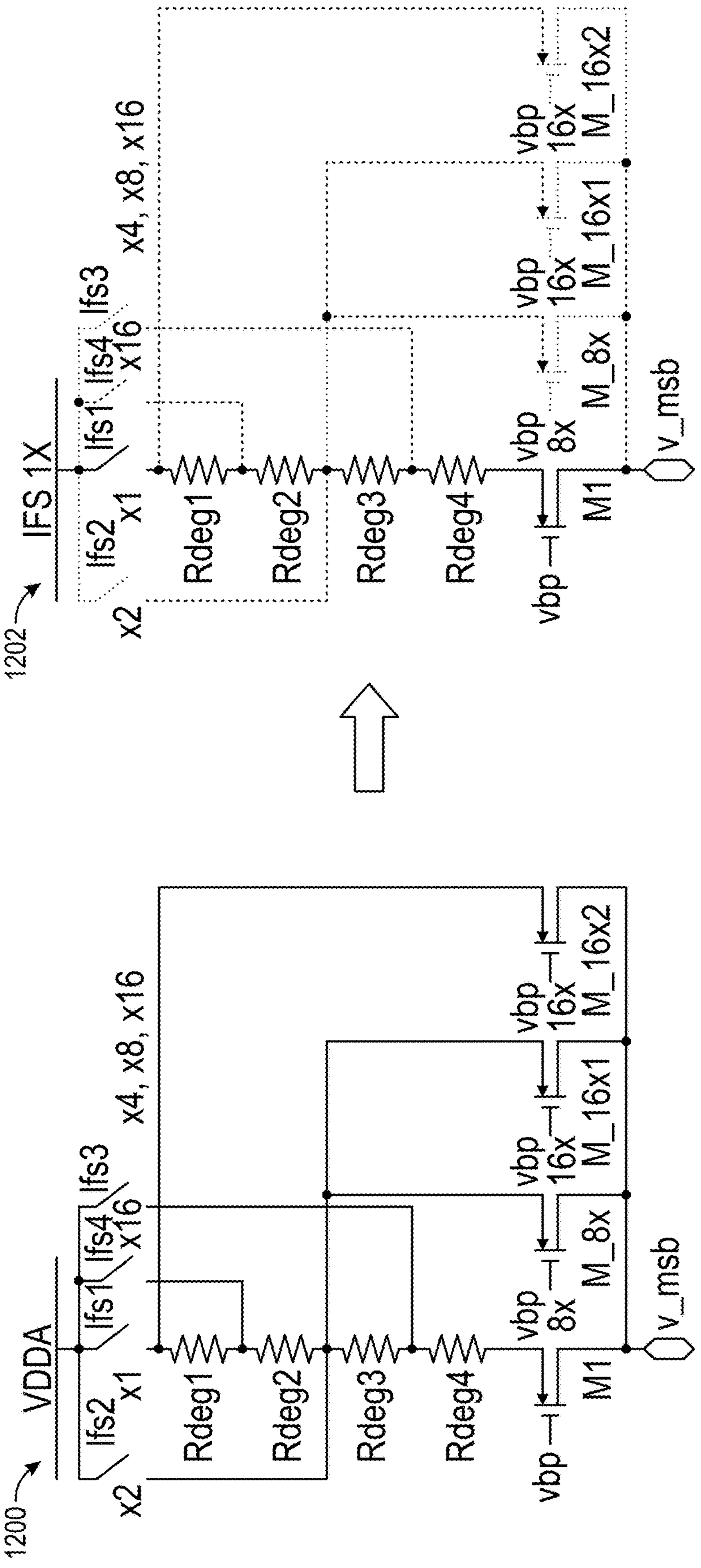
FIGS. 12A, 12B, and 12C illustrate an example DAC cell configurable to support an $I_{FS}$ of up to sixteen times a base value, in accordance with certain aspects of the present disclosure.
Figure 12B:
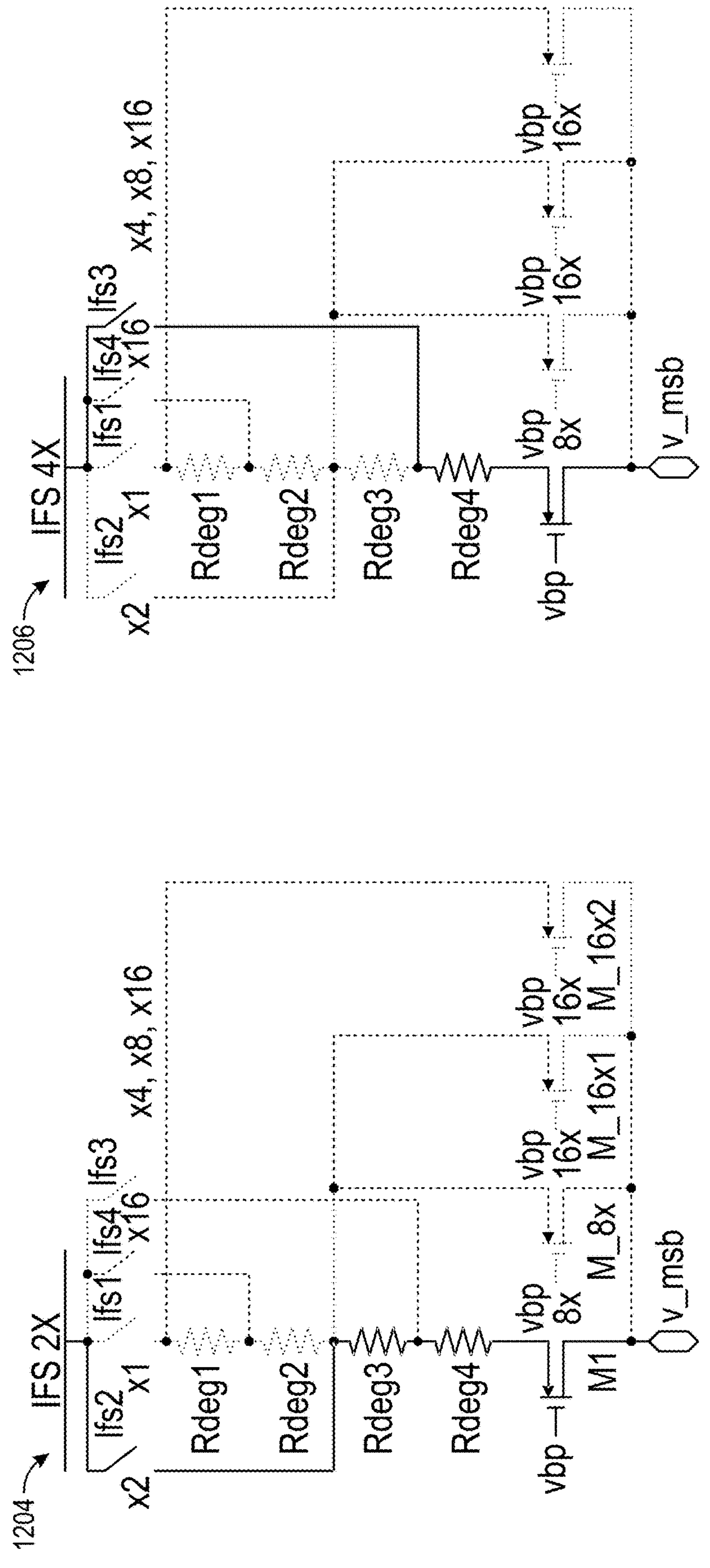
Figure 12C:
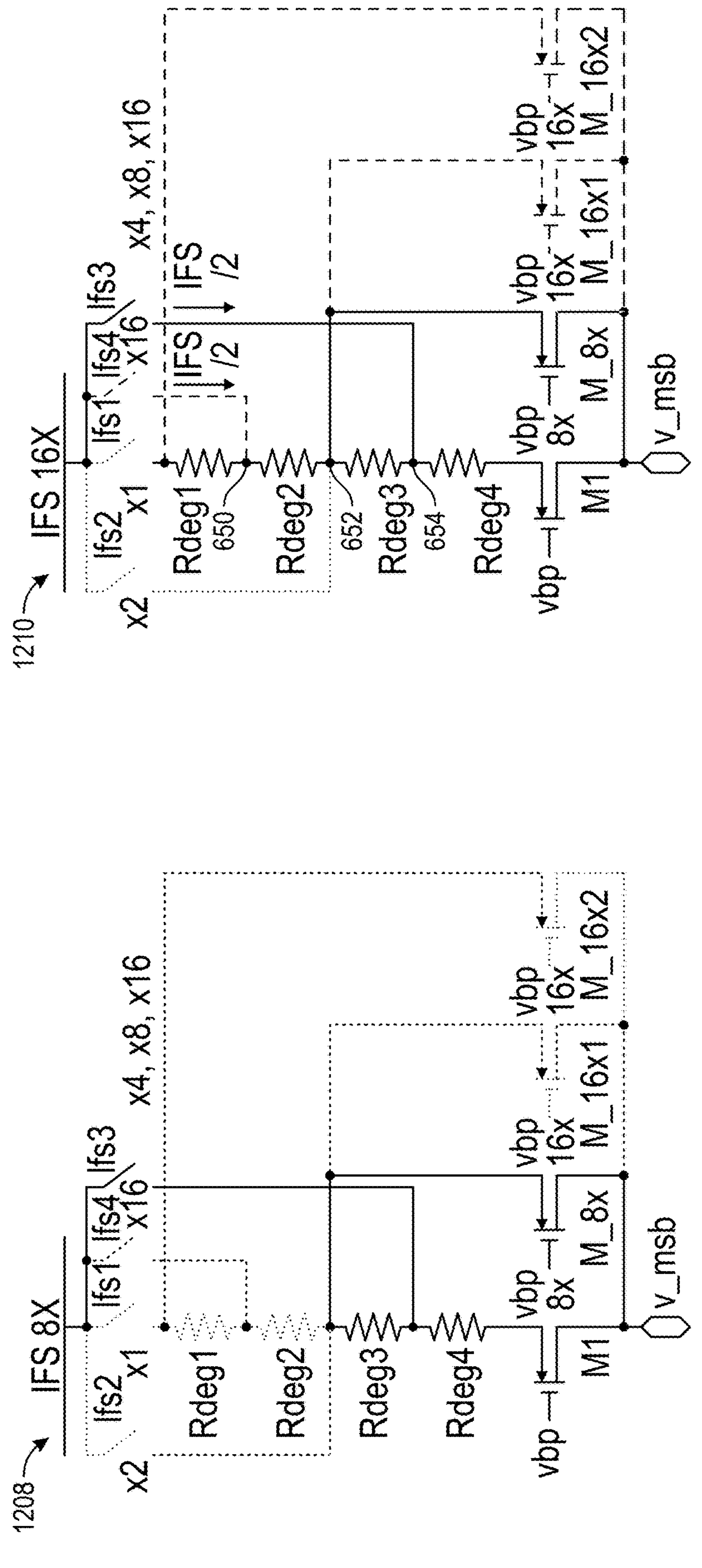

FIGS. 12A, 12B, and 12C illustrate a DAC cell 1200 configurable to support an $I_{FS}$ of 1x, 2x, 4x, 8x, and 16x, in accordance with certain aspects of the present disclosure. The DAC cell 1200 of FIG. 12A may be used to implement each of multiple DAC cells (e.g., corresponding to DAC cells 1102) and a bias branch (e.g., corresponding to bias branch 1108). As shown in diagram 1202 of FIG. 12A, the switch Ifs1 is closed, and transistor M1 is turned on, providing $I_{FS}$ from VDDA to the v_msb node through $R_{deg1}$ to $R_{deg4}$. As shown in diagram 1204 of FIG. 12B, when operating with $I_{FS}$ of 2x, switch Ifs2 is closed, and transistor M1 is turned on, providing $I_{FS}$ from VDDA to the v_msb node through $R_{deg3}$ and $R_{deg4}$. As shown in diagram 1206 of FIG. 12B, when operating with $I_{FS}$ of 4x, switch Ifs3 is closed, and transistor M1 is turned on, providing $I_{FS}$ from VDDA to the v_msb node through $R_{deg4}$. As shown in diagram 1208 of FIG. 12C, when operating with $I_{FS}$ of 8x, switch Ifs3 is closed, and transistors M1 and M_8x are turned on, providing a portion (e.g., half) of $I_{FS}$ from VDDA to the v_msb node through $R_{deg3}$ and a portion (e.g., half) of $I_{FS}$ from VDDA to the v_msb node through $R_{deg4}$. As shown in diagram 1210 of FIG. 12C, when operating with $I_{FS}$ of 16x, switches Ifs3 and Ifs4 are closed, and transistors M1, M_8*x*, M_16*x*1, and M_16*x*2 are turned on, providing a portion (e.g., half) of $I_{FS}$ from VDDA to node 650 through switch Ifs4 and a portion (e.g., half) of $I_{FS}$ from VDDA to node 654 through switch Ifs3. The current though Ifs3 splits such that a portion (e.g., half) of the current through switch Ifs3 flows through $R_{deg3}$ and a portion (e.g., half) of the current through switch Ifs3 flows through $R_{deg4}$. Similarly, the current though Ifs4 splits such that a portion (e.g., half) of the current through switch Ifs4 flows through $R_{deg1}$ and a portion (e.g., half) of the current through switch Ifs4 flows through $R_{deg2}$.

Using four resistive elements $R_{deg1}$ to $R_{deg4}$, a 16x $I_{FS}$ may be achieved as shown. A programmable current source structure may be provided that covers $I_{FS}$ of 1x to 16x. For $I_{FS}$ 1x to 8x, the vbp_16*x* node may be shorted to VDDA to turn off the transistors M_16*x*1 and M_16*x*2. For $I_{FS}$ of 16x, the vbp_16*x* node may be shorted to the vbp node and the vbp_8*x* node to turn on the transistors M_16*x*1 and M_16*x*2. Overall, assuming the resistances of $R_{deg1}$ to $R_{deg4}$ are equal to R, the resistance between VDDA and the v_msb node may be equal to 4R when operating with $I_{FS}$ of 1x, equal to 2R when operating with $I_{FS}$ of 2x, equal to R when operating with $I_{FS}$ of 4x, equal to R/2 when operating with $I_{FS}$ of 8x, and equal to R/4 when operating with $I_{FS}$ of 16x. Certain aspects reduce the size of the DAC by two-and-a-half times as compared to some conventional implementations.

Figure 13:
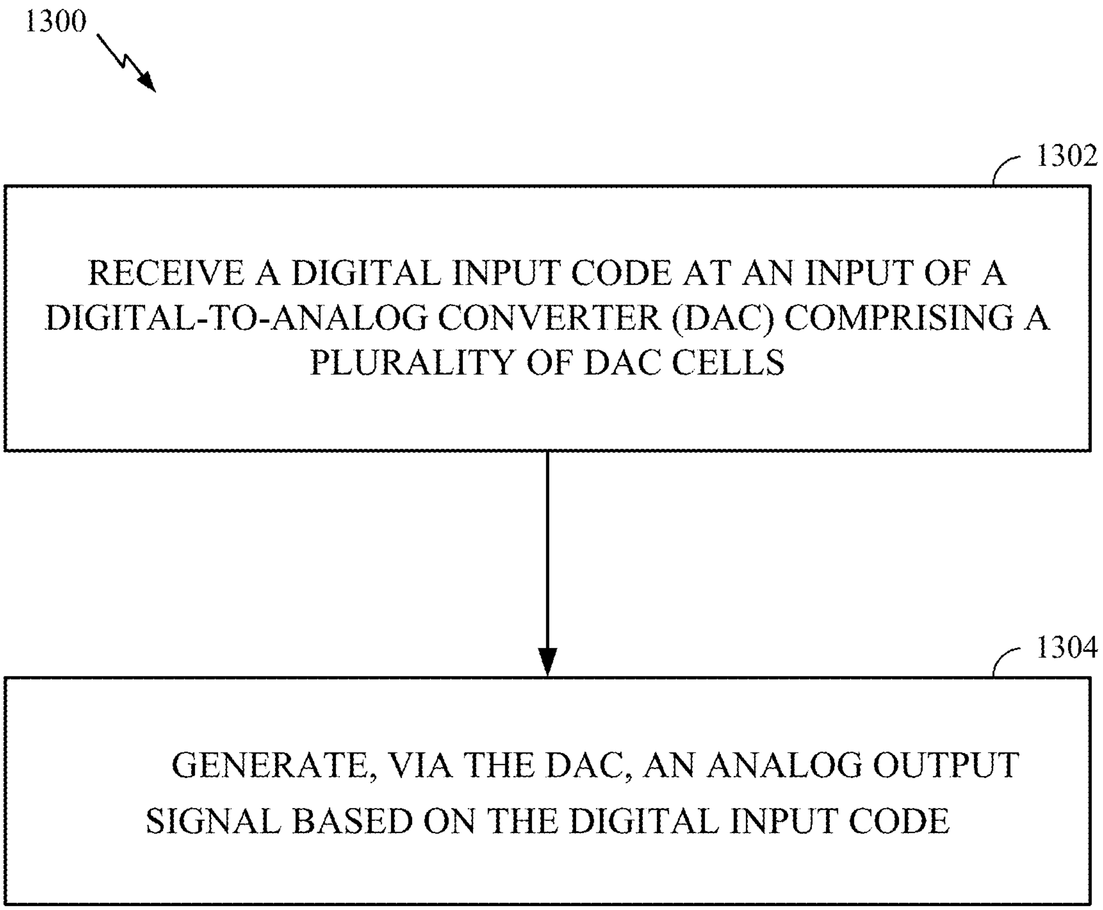
FIG. 13 is a flow diagram illustrating example operations for digital-to-analog conversion, in accordance with certain aspects of the present disclosure.

FIG. 13 is a flow diagram illustrating example operations 1300 for digital-to-analog conversion, in accordance with certain aspects of the present disclosure. The operations 1300 may be performed, for example, by a DAC such as the DAC 600 or the DAC 1100. The DAC may be implemented using any suitable DAC cell and associated bias branch. For example, the DAC may include one or more DAC cells (and associated bias branch with a similar circuit structure), such as the DAC cell 700, 800, 900, or 1000.

At block 1302, the DAC may receive a digital input code at an input of a digital-to-analog converter (DAC) comprising a plurality of DAC cells.

At block 1304, the DAC may generate an analog output signal based on the digital input code. Each DAC cell of a set of the DAC cells may include a first current source (e.g., transistor M1) coupled to an output (e.g., v_msb node) of the DAC cell, a second current source (e.g., transistor M_8*x*) coupled to the output of the DAC cell, and a resistive network including a plurality of resistive elements coupled between a voltage rail (e.g., VDDA) and the first current source. The resistive network may be coupled to the first current source and the second current source. A plurality of switches may be coupled between the voltage rail and nodes of the resistive network.

In some aspects, the plurality of resistive elements include a first resistive element (e.g., $R_{deg1}$), a second resistive element (e.g., $R_{deg2}$), a third resistive element (e.g., $R_{deg3}$), and a fourth resistive element (e.g., $R_{deg4}$). The second resistive element may be coupled between the first resistive element and the third resistive element, and the third resistive element may be coupled between the second resistive element and the fourth resistive element.

In some aspects, the plurality of switches includes a first switch (e.g., switch Ifs1 of FIG. 7) coupled between the voltage rail and the first resistive element of the plurality of resistive elements. The DAC may close the first switch when operating the DAC with an $I_{FS}$ of a base value (e.g., $I_{FS}$ of 1x). The plurality of switches may include a second switch (e.g., switch Ifs2 of FIG. 7) coupled between the voltage rail and a node between the third resistive element and the fourth resistive element. The DAC may close the second switch when operating the DAC with an $I_{FS}$ of four times the base value (e.g., Ifs of 4x) or eight times the base value (e.g., $I_{FS}$ of 8x). The plurality of switches may include a third switch (e.g., switch Ifs3 of FIG. 7) coupled between the voltage rail and a node between the second resistive element and the third resistive element. The DAC may close the third switch when operating the DAC with an $I_{FS}$ of two times the base value (e.g., $I_{FS}$ of 2x). In some aspects, the first current source is coupled between the fourth resistive element and the output of the DAC cell, and the second current source is coupled between the output of the DAC cell and a node between the second resistive element and the third resistive element.

In some aspects, the plurality of switches includes a first switch (e.g., switch Ifs1 of FIG. 8 or FIG. 10) coupled between the voltage rail and a first resistive element of the plurality of resistive elements. The DAC may close the first switch when operating the DAC with an $I_{FS}$ of a base value or two times the base value. The plurality of switches may include a second switch (e.g., switch Ifs2 of FIG. 8 or FIG. 10) coupled between the voltage rail and a node between the third resistive element and the fourth resistive element. The DAC may close the second switch when operating the DAC with an $I_{FS}$ of four times the base value or eight times the base value. The plurality of switches may include a third switch (e.g., switch Ifs3 of FIG. 8 or FIG. 10) coupled between the first current source and a node between the second resistive element and the third resistive element. The DAC may close the third switch when operating the DAC with an $I_{FS}$ of two times the base value or eight times the base value. In some aspects, the first current source (e.g., transistor M1 of FIG. 8) may be coupled between the fourth resistive element and the output of the DAC cell, and the second current source (e.g., transistor M_8*x* of FIG. 8) may be coupled between the fourth resistive element and the output of the DAC cell. In some aspects, the first current source (e.g., transistor M1 of FIG. 10) may be coupled between the fourth resistive element and the output of the DAC cell, and the second current source (e.g., transistor M_8*x* of FIG. 10) may be coupled between the output of the DAC cell and a node between the second resistive element and the third resistive element.

In some aspects, the plurality of switches includes a first switch (e.g., switch Ifs1 of FIG. 9) coupled between the voltage rail and the first resistive element of the plurality of resistive elements. The DAC may close the first switch when operating the DAC with an $I_{FS}$ of a base value. The plurality of switches may include a second switch (e.g., switch Ifs2 of FIG. 9) coupled between the voltage rail and a first node between the second resistive element and the third resistive element. The DAC may close the second switch when operating the DAC with an $I_{FS}$ of two times, four times, or eight times the base value. The plurality of switches may include a third switch (e.g., switch Ifs3 of FIG. 9) coupled between the first switch and the first current source. The DAC may close the third switch when operating the DAC with an $I_{FS}$ of four times the base value. The plurality of switches may include a fourth switch (e.g., switch Ifs4 of FIG. 9) coupled between a second node and a third node, the second node being between the first resistive element and the second resistive element and the third node being between the third resistive element and the fourth resistive element. The DAC may close the fourth switch when operating the DAC with an $I_{FS}$ of eight times the base value. The plurality of switches may include a fifth switch (e.g., switch Ifs5 of FIG. 9) coupled between the third node and the first current source. The DAC may close the fifth switch when operating the DAC with an $I_{FS}$ of eight times the base value.

In some aspects, the DAC may include a third current source (e.g., transistor M_16*x*1 of FIGS. 11A and 11B) coupled between the resistive network and the output of the DAC cell and a fourth current source (e.g., transistor M_16*x*2 of FIGS. 11A and 11B) coupled between the resistive network and the output of the DAC cell. The plurality of resistive elements may include a first switch (e.g., switch Ifs1 of FIGS. 11A and 11B) coupled between the voltage rail and the first resistive element. The DAC may close the first switch when operating the DAC with an $I_{FS}$ of a base value. The plurality of switches may include a second switch (e.g., switch Ifs2 of FIGS. 11A and 11B) coupled between the voltage rail and a node between the second resistive element and the third resistive element. The DAC may close the second switch when operating the DAC with an $I_{FS}$ of two times the base value. The plurality of switches may include a third switch (e.g., switch Ifs3 of FIGS. 11A and 11B) coupled between the voltage rail and a node between the third resistive element and the fourth resistive element. The DAC may close the third switch when operating the DAC with an $I_{FS}$ of four times, eight times, or sixteen times the base value. The plurality of switches may include a fourth switch (e.g., switch Ifs4 of FIGS. 11A and 11B) coupled between the voltage rail and a node between the first resistive element and the second resistive element. The DAC may close the fourth switch when operating the DAC with an $I_{FS}$ of sixteen times the base value.

In some aspects, the DAC may include a first switch (e.g., switch 620 of FIG. 6) coupled between a bias node and a gate of a transistor used to implement the second current source. The DAC may also include a second switch (e.g., switch 622 of FIG. 6) coupled between the voltage rail and the gate of the transistor used to implement the second current source.

Example Aspects

In addition to the various aspects described above, specific combinations of aspects are within the scope of the present disclosure, some of which are detailed below:

Aspect 1: A digital-to-analog converter (DAC) comprising a plurality of DAC cells, wherein at least one of the DAC cells comprises: a first current source coupled to an output of the DAC cell; a second current source coupled to the output of the DAC cell; a resistive network including a plurality of resistive elements coupled between a voltage rail and the first current source, wherein the resistive network is coupled to the first current source and the second current source; and a plurality of switches coupled between the voltage rail and nodes of the resistive network.

Aspect 2: The DAC of Aspect 1, wherein: the plurality of resistive elements includes a first resistive element, a second resistive element, a third resistive element, and a fourth resistive element; the second resistive element is coupled between the first resistive element and the third resistive element; and the third resistive element is coupled between the second resistive element and the fourth resistive element.

Aspect 3: The DAC of Aspect 2, wherein the plurality of switches includes: a first switch coupled between the voltage rail and the first resistive element of the plurality of resistive elements; a second switch coupled between the voltage rail and a node between the third resistive element and the fourth resistive element; and a third switch coupled between the voltage rail and a node between the second resistive element and the third resistive element.

Aspect 4: The DAC of Aspect 2 or 3, wherein the first current source is coupled between the fourth resistive element and the output of the DAC cell, and wherein the second current source is coupled between the output of the DAC cell and a node between the second resistive element and the third resistive element.

Aspect 5: The DAC according to any of Aspects 2-4, wherein the plurality of switches includes: a first switch coupled between the voltage rail and the first resistive element of the plurality of resistive elements; a second switch coupled between the voltage rail and a node between the third resistive element and the fourth resistive element; and a third switch coupled between the first current source and a node between the second resistive element and the third resistive element.

Aspect 6: The DAC according to any of Aspects 2-5, wherein: the first current source is coupled between the fourth resistive element and the output of the DAC cell; and the second current source is coupled between the fourth resistive element and the output of the DAC cell.

Aspect 7: The DAC according to any of Aspects 2-6, wherein: the first current source is coupled between the fourth resistive element and the output of the DAC cell; and the second current source is coupled between the output of the DAC cell and a node between the second resistive element and the third resistive element.

Aspect 8: The DAC according to any of Aspects 2-7, wherein the plurality of switches includes: a first switch coupled between the voltage rail and the first resistive element of the plurality of resistive elements; a second switch coupled between the voltage rail and a first node between the second resistive element and the third resistive element; a third switch coupled between the first switch and the first current source; a fourth switch coupled between a second node and a third node, the second node being between the first resistive element and the second resistive element and the third node being between the third resistive element and the fourth resistive element; and a fifth switch coupled between the third node and the first current source.

Aspect 9: The DAC according to any of Aspects 2-8, further comprising: a third current source coupled between the resistive network and the output of the DAC cell; and a fourth current source coupled between the resistive network and the output of the DAC cell.

Aspect 10: The DAC of Aspect 9, wherein the plurality of resistive elements further includes: a first switch coupled between the voltage rail and the first resistive element; a second switch coupled between the voltage rail and a node between the second resistive element and the third resistive element; a third switch coupled between the voltage rail and a node between the third resistive element and the fourth resistive element; and a fourth switch coupled between the voltage rail and a node between the second resistive element and the third resistive element.

Aspect 11: The DAC according to any of Aspects 1-10, further comprising: a first switch coupled between a bias node and a gate of a transistor used to implement the second current source; and a second switch coupled between the voltage rail and the gate of the transistor used to implement the second current source.

Aspect 12: A method for digital-to-analog conversion, comprising: receiving a digital input code at an input of a digital-to-analog converter (DAC) comprising a plurality of DAC cells; and generating, via the DAC, an analog output signal based on the digital input code, wherein each DAC cell in a set of the DAC cells comprises: a first current source coupled to an output of the DAC cell; a second current source coupled to the output of the DAC cell; a resistive network including a plurality of resistive elements coupled between a voltage rail and the first current source, wherein the resistive network is coupled to the first current source and the second current source; and a plurality of switches coupled between the voltage rail and nodes of the resistive network.

Aspect 13: The method of Aspect 12, wherein: the plurality of resistive elements includes a first resistive element, a second resistive element, a third resistive element, and a fourth resistive element; the second resistive element is coupled between the first resistive element and the third resistive element; and the third resistive element is coupled between the second resistive element and the fourth resistive element.

Aspect 14: The method of Aspect 13, wherein the plurality of switches includes: a first switch coupled between the voltage rail and the first resistive element of the plurality of resistive elements, the method further comprising closing the first switch when operating the DAC with a full-scale current (IFS) of a base value; a second switch coupled between the voltage rail and a node between the third resistive element and the fourth resistive element, the method further comprising closing the second switch when operating the DAC with an IFS of four times the base value or eight times the base value; and a third switch coupled between the voltage rail and a node between the second resistive element and the third resistive element, the method further comprising closing the third switch when operating the DAC with an IFS of two times the base value.

Aspect 15: The method of Aspect 13 or 14, wherein the first current source is coupled between the fourth resistive element and an output of the DAC cell, and wherein the second current source is coupled between the output of the DAC cell and a node between the second resistive element and the third resistive element.

Aspect 16: The method according to any of Aspects 13-15, wherein the plurality of switches includes: a first switch coupled between the voltage rail and the first resistive element of the plurality of resistive elements, the method further comprising closing the first switch when operating the DAC with an IFS of a base value or two times the base value; a second switch coupled between the voltage rail and a node between the third resistive element and the fourth resistive element, the method further comprising closing the second switch when operating the DAC with an IFS of four times the base value or eight times the base value; and a third switch coupled between the first current source and a node between the second resistive element and the third resistive element, the method further comprising closing the third switch when operating the DAC with an IFS of two times the base value or eight times the base value.

Aspect 17: The method according to any of Aspects 13-16, wherein the plurality of switches includes: a first switch coupled between the voltage rail and the first resistive element of the plurality of resistive elements, the method further comprising closing the first switch when operating the DAC with an IFS of a base value; a second switch coupled between the voltage rail and a first node between the second resistive element and the third resistive element, the method further comprising closing the second switch when operating the DAC with an IFS of two times, four times, or eight times the base value; a third switch coupled between the first switch and the first current source, the method further comprising closing the third switch when operating the DAC with an IFS of four times the base value; a fourth switch coupled between a second node and a third node, the second node being between the first resistive element and the second resistive element and the third node being between the third resistive element and the fourth resistive element, the method further comprising closing the fourth switch when operating the DAC with an IFS of eight times the base value; and a fifth switch coupled between the third node and the first current source, the method further comprising closing the fifth switch when operating the DAC with an IFS of eight times the base value.

Aspect 18: The method according to any of Aspects 13-17, further comprising: a third current source coupled between the resistive network and the output of the DAC cell; and a fourth current source coupled between the resistive network and the output of the DAC cell.

Aspect 19: The method of Aspect 18, wherein the plurality of resistive elements further includes: a first switch coupled between the voltage rail and the first resistive element, the method further comprising closing the first switch when operating the DAC with an IFS of a base value; a second switch coupled between the voltage rail and a node between the second resistive element and the third resistive element, the method further comprising closing the second switch when operating the DAC with an IFS of two times the base value; a third switch coupled between the voltage rail and a node between the third resistive element and the fourth resistive element, the method further comprising closing the third switch when operating the DAC with an IFS of four times, eight times, or sixteen times the base value; and a fourth switch coupled between the voltage rail and a node between the first resistive element and the second resistive element, the method further comprising closing the fourth switch when operating the DAC with an IFS of sixteen times the base value.

Aspect 20: A wireless device comprising: one or more antennas; a digital-to-analog converter (DAC) comprising a plurality of DAC cells; and a transmit path coupled between the DAC and the one or more antennas, wherein at least one of the DAC cells comprises: a first current source coupled to an output of the DAC cell; a second current source coupled to the output of the DAC cell; a resistive network including a plurality of resistive elements coupled between a voltage rail and the first current source, wherein the resistive network is coupled to the first current source and the second current source; and a plurality of switches coupled between the voltage rail and nodes of the resistive network.

CONCLUSION

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A digital-to-analog converter (DAC) comprising a plurality of DAC cells, wherein at least one of the DAC cells comprises:

a first current source coupled to an output of the DAC cell, wherein a control input of the first current source is coupled to a first bias node of the DAC;

a second current source coupled to the output of the DAC cell, wherein a control input of the second current source is coupled to a second bias node of the DAC, the second bias node being different than the first bias node;

a resistive network including a plurality of resistive elements coupled between a voltage rail and the first current source, wherein the resistive network is coupled to the first current source and the second current source; and a plurality of switches coupled between the voltage rail and nodes of the resistive network.

2. The DAC of claim 1, wherein:

the plurality of resistive elements includes a first resistive element, a second resistive element, a third resistive element, and a fourth resistive element;

the second resistive element is coupled between the first resistive element and the third resistive element; and the third resistive element is coupled between the second resistive element and the fourth resistive element.

3. The DAC of claim 2, wherein the plurality of switches includes:

a first switch coupled between the voltage rail and the first resistive element of the plurality of resistive elements;

a second switch coupled between the voltage rail and a node between the third resistive element and the fourth resistive element; and a third switch coupled between the voltage rail and a node between the second resistive element and the third resistive element.

4. The DAC of claim 2, wherein the first current source is coupled between the fourth resistive element and the output of the DAC cell, and wherein the second current source is coupled between the output of the DAC cell and a node between the second resistive element and the third resistive element.

5. The DAC of claim 2, wherein the plurality of switches includes:

a first switch coupled between the voltage rail and the first resistive element of the plurality of resistive elements;

a second switch coupled between the voltage rail and a node between the third resistive element and the fourth resistive element; and a third switch coupled between the first current source and a node between the second resistive element and the third resistive element.

6. The DAC of claim 2, wherein:

the first current source is coupled between the fourth resistive element and the output of the DAC cell; and the second current source is coupled between the fourth resistive element and the output of the DAC cell.

7. The DAC of claim 2, wherein:

the first current source is coupled between the fourth resistive element and the output of the DAC cell; and the second current source is coupled between the output of the DAC cell and a node between the second resistive element and the third resistive element.

8. The DAC of claim 2, wherein the plurality of switches includes:

a first switch coupled between the voltage rail and the first resistive element of the plurality of resistive elements;

a second switch coupled between the voltage rail and a first node between the second resistive element and the third resistive element;

a third switch coupled between the first switch and the first current source;

a fourth switch coupled between a second node and a third node, the second node being between the first resistive element and the second resistive element and the third node being between the third resistive element and the fourth resistive element; and a fifth switch coupled between the third node and the first current source.

9. The DAC of claim 2, further comprising:

a third current source coupled between the resistive network and the output of the DAC cell; and a fourth current source coupled between the resistive network and the output of the DAC cell.

10. The DAC of claim 9, wherein the plurality of resistive elements further includes:

a first switch coupled between the voltage rail and the first resistive element;

a second switch coupled between the voltage rail and a node between the second resistive element and the third resistive element;

a third switch coupled between the voltage rail and a node between the third resistive element and the fourth resistive element; and a fourth switch coupled between the voltage rail and a node between the second resistive element and the third resistive element.

11. The DAC of claim 1, further comprising:

a first switch coupled between the first bias node and the second bias node; and a second switch coupled between the voltage rail and the second bias node.

12. A method for digital-to-analog conversion, comprising:

receiving a digital input code at an input of a digital-to-analog converter (DAC) comprising a plurality of DAC cells; and generating, via the DAC, an analog output signal based on the digital input code, wherein each DAC cell in a set of the DAC cells comprises:

a first current source coupled to an output of the DAC cell, wherein a control input of the first current source is coupled to a first bias node of the DAC;

a second current source coupled to the output of the DAC cell, wherein a control input of the second current source is coupled to a second bias node of the DAC, the second bias node being different than the first bias node;

a resistive network including a plurality of resistive elements coupled between a voltage rail and the first current source, wherein the resistive network is coupled to the first current source and the second current source; and a plurality of switches coupled between the voltage rail and nodes of the resistive network.

13. The method of claim 12, wherein:

the plurality of resistive elements includes a first resistive element, a second resistive element, a third resistive element, and a fourth resistive element;

the second resistive element is coupled between the first resistive element and the third resistive element; and the third resistive element is coupled between the second resistive element and the fourth resistive element.

14. The method of claim 13, wherein the plurality of switches includes:

a first switch coupled between the voltage rail and the first resistive element of the plurality of resistive elements, the method further comprising closing the first switch when operating the DAC with a full-scale current (IFS) of a base value;

a second switch coupled between the voltage rail and a node between the third resistive element and the fourth resistive element, the method further comprising closing the second switch when operating the DAC with an $I_{FS}$ of four times the base value or eight times the base value; and a third switch coupled between the voltage rail and a node between the second resistive element and the third resistive element, the method further comprising closing the third switch when operating the DAC with an $I_{FS}$ of two times the base value.

15. The method of claim 13, wherein the first current source is coupled between the fourth resistive element and an output of the DAC cell, and wherein the second current source is coupled between the output of the DAC cell and a node between the second resistive element and the third resistive element.

16. The method of claim 13, wherein the plurality of switches includes:

a first switch coupled between the voltage rail and the first resistive element of the plurality of resistive elements, the method further comprising closing the first switch when operating the DAC with an $I_{FS}$ of a base value or two times the base value;

a second switch coupled between the voltage rail and a node between the third resistive element and the fourth resistive element, the method further comprising closing the second switch when operating the DAC with an $I_{FS}$ of four times the base value or eight times the base value; and a third switch coupled between the first current source and a node between the second resistive element and the third resistive element, the method further comprising closing the third switch when operating the DAC with an $I_{FS}$ of two times the base value or eight times the base value.

17. The method of claim 13, wherein the plurality of switches includes:

a first switch coupled between the voltage rail and the first resistive element of the plurality of resistive elements, the method further comprising closing the first switch when operating the DAC with an $I_{FS}$ of a base value;

a second switch coupled between the voltage rail and a first node between the second resistive element and the third resistive element, the method further comprising closing the second switch when operating the DAC with an $I_{FS}$ of two times, four times, or eight times the base value;

a third switch coupled between the first switch and the first current source, the method further comprising closing the third switch when operating the DAC with an $I_{FS}$ of four times the base value;

a fourth switch coupled between a second node and a third node, the second node being between the first resistive element and the second resistive element and the third node being between the third resistive element and the fourth resistive element, the method further comprising closing the fourth switch when operating the DAC with an $I_{FS}$ of eight times the base value; and a fifth switch coupled between the third node and the first current source, the method further comprising closing the fifth switch when operating the DAC with an $I_{FS}$ of eight times the base value.

18. The method of claim 13, further comprising:

a third current source coupled between the resistive network and the output of the DAC cell; and a fourth current source coupled between the resistive network and the output of the DAC cell.

19. The method of claim 18, wherein the plurality of resistive elements further includes:

a first switch coupled between the voltage rail and the first resistive element, the method further comprising closing the first switch when operating the DAC with an $I_{FS}$ of a base value;

a second switch coupled between the voltage rail and a node between the second resistive element and the third resistive element, the method further comprising closing the second switch when operating the DAC with an $I_{FS}$ of two times the base value;

a third switch coupled between the voltage rail and a node between the third resistive element and the fourth resistive element, the method further comprising closing the third switch when operating the DAC with an $I_{FS}$ of four times, eight times, or sixteen times the base value; and a fourth switch coupled between the voltage rail and a node between the first resistive element and the second resistive element, the method further comprising closing the fourth switch when operating the DAC with an $I_{FS}$ of sixteen times the base value.

20. A wireless device comprising:

one or more antennas;

a digital-to-analog converter (DAC) comprising a plurality of DAC cells; and a transmit path coupled between the DAC and the one or more antennas, wherein at least one of the DAC cells comprises:

a first current source coupled to an output of the DAC cell, wherein a control input of the first current source is coupled to a first bias node of the DAC;

a second current source coupled to the output of the DAC cell, wherein a control input of the second current source is coupled to a second bias node of the DAC, the second bias node being different than the first bias node;

a resistive network including a plurality of resistive elements coupled between a voltage rail and the first current source, wherein the resistive network is coupled to the first current source and the second current source; and a plurality of switches coupled between the voltage rail and nodes of the resistive network.

* * * * *